US012604560B2

(12) United States Patent
Tao et al.

(10) Patent No.: US 12,604,560 B2
(45) Date of Patent: Apr. 14, 2026

(54) SOLAR CELLS FORMED VIA ALUMINUM ELECTROPLATING

(71) Applicants: Meng Tao, Fountain Hills, AZ (US);
Wen-Cheng Sun, Tempe, AZ (US);
Xiaofei Han, Tempe, AZ (US)

(72) Inventors: Meng Tao, Fountain Hills, AZ (US);
Wen-Cheng Sun, Tempe, AZ (US);
Xiaofei Han, Tempe, AZ (US)

(73) Assignee: **ARIZONA BOARD OF REGENTS
ON BEHALF OF ARIZONA STATE
UNIVERSITY**, Scottsdale, AZ (US)

( * ) Notice: Subject to any disclaimer, the term of this
patent is extended or adjusted under 35
U.S.C. 154(b) by 158 days.

(21) Appl. No.: 18/315,630

(22) Filed: May 11, 2023

(65) Prior Publication Data

US 2023/0299216 A1 Sep. 21, 2023

Related U.S. Application Data

(60) Continuation of application No. 16/432,702, filed on
Jun. 5, 2019, now Pat. No. 11,682,739, which is a
(Continued)

(51) Int. Cl.
H10F 77/20 (2025.01)
C25D 3/44 (2006.01)
(Continued)

(52) U.S. Cl.
CPC ............. H10F 77/227 (2025.01); C25D 3/44
(2013.01); C25D 3/665 (2013.01); C25D 5/50
(2013.01);
(Continued)

(58) Field of Classification Search
CPC ..... H01L 31/022458; H01L 31/022425; H01L
31/1864; C25D 3/665; C25D 3/44;
(Continued)

(56) References Cited

U.S. PATENT DOCUMENTS 4,507,181 A * 3/1985 Nath ...................... C25D 7/126
136/258
8,303,791 B2 11/2012 Basker et al.
(Continued)

FOREIGN PATENT DOCUMENTS

WO 2014004610 1/2014
WO 2014201207 12/2014
(Continued)

OTHER PUBLICATIONS

M. S. Haque "Degradation and failure mechanisms of a-Si:H solar
cells with aluminum contacts," Proceedings of 1994 IEEE 1st World
Conference on Photovoltaic Energy Conversion—WCPEC (A Joint
Conference of PVSC, PVSEC and PSEC), Waikoloa, HI, USA,
1994, pp. 642-645 vol.1. (Year: 1994).*
(Continued)

*Primary Examiner* — Devina Pillay
(74) *Attorney, Agent, or Firm* — SNELL & WILMER
L.L.P.

(57) ABSTRACT

Electroplating of aluminum may be utilized to form elec-
trodes for solar cells. In contrast to expensive silver elec-
trodes, aluminum allows for reduced cell cost and addresses
the problem of material scarcity. In contrast to copper
electrodes which typically require barrier layers, aluminum
allows for simplified cell structures and fabrication steps. In
the solar cells, point contacts may be utilized in the backside
electrodes for increased efficiency. Solar cells formed in
accordance with the present disclosure enable large-scale
and cost-effective deployment of solar photovoltaic systems.

15 Claims, 19 Drawing Sheets

Related U.S. Application Data division of application No. 15/079,359, filed on Mar. 24, 2016, now abandoned, which is a continuation of application No. PCT/US2014/067338, filed on Nov. 25, 2014.

(60) Provisional application No. 62/055,378, filed on Sep. 25, 2014, provisional application No. 62/018,320, filed on Jun. 27, 2014, provisional application No. 61/908,824, filed on Nov. 26, 2013.

(51) Int. Cl.

| | |
|---|---|
| *C25D 3/66* | (2006.01) |
| *C25D 5/50* | (2006.01) |
| *C25D 7/12* | (2006.01) |
| *H10F 71/00* | (2025.01) |

(52) U.S. Cl.
CPC .............. *C25D 7/12* (2013.01); *C25D 7/126* (2013.01); *H10F 71/128* (2025.01); *H10F 77/211* (2025.01); *Y02E 10/50* (2013.01); *Y02P 70/50* (2015.11)

(58) Field of Classification Search
CPC .. C25D 5/50; C25D 7/126; C25D 7/12; Y02P 70/50; Y02E 10/50; H10F 77/227; H10F 77/211; H10F 71/128
See application file for complete search history.

(56) References Cited

U.S. PATENT DOCUMENTS

| | | | |
|---|---|---|---|
| 9,783,898 B2 | 10/2017 | Tao et al. | |
| 10,072,345 B2 | 9/2018 | Tao | |
| 2005/0012783 A1* | 1/2005 | Kuk ..................... | B41J 2/14056 347/65 |
| 2008/0128268 A1* | 6/2008 | Lopatin ................... | C25D 7/08 204/192.1 |
| 2009/0301886 A1* | 12/2009 | Hoshi ...................... | C25D 3/44 205/261 |
| 2010/0108524 A1 | 5/2010 | van Mol et al. | |
| 2010/0263725 A1* | 10/2010 | Schmidt ............ | C23C 16/45542 438/57 |
| 2011/0062028 A1 | 3/2011 | Lippert et al. | |
| 2011/0100453 A1* | 5/2011 | Clevenger ....... | H01L 31/022425 257/E31.124 |
| 2011/0278172 A1 | 11/2011 | Cotte et al. | |
| 2013/0014812 A1* | 1/2013 | Fisher ................... | H01L 31/068 257/E31.119 |
| 2013/0240023 A1* | 9/2013 | Sewell ............ | H01L 31/022441 257/E31.13 |
| 2014/0065764 A1* | 3/2014 | Scardera ............. | H01L 31/0682 257/E31.124 |
| 2015/0017793 A1* | 1/2015 | Hallam ............... | H01L 31/1864 438/540 |
| 2016/0204289 A1 | 7/2016 | Tao et al. | |
| 2017/0133854 A1 | 5/2017 | Tao | |
| 2018/0291477 A1 | 10/2018 | Tao et al. | |
| 2019/0312162 A1 | 10/2019 | Tao et al. | |

FOREIGN PATENT DOCUMENTS

| | | |
|---|---|---|
| WO | 2015081077 | 6/2015 |
| WO | 2017100443 | 6/2017 |

OTHER PUBLICATIONS

USPTO, Restriction Requirement dated Mar. 27, 2020 in U.S. Appl. No. 16/113,822.

USPTO, Office Action dated Aug. 24, 2020 U.S. Appl. No. 16/113,822.

USPTO, Final Office Action dated Apr. 14, 2021 U.S. Appl. No. 16/113,822.

USPTO, Office Action dated Oct. 29, 2021 U.S. Appl. No. 16/113,822.

USPTO, Final Office Action dated Mar. 15, 2022 U.S. Appl. No. 16/113,822.

Han, X. et al., Proceedings of the 40th IEEE Photovoltaic Specialists Conference (Denver, 2014), p. 2481.

Hurley, F. H. et al. J. Electrochem. Soc., 98 (5), 207-207 (1951).

Carlin, R.T. et al., J. Electrochem. Soc., 139 (10), 2720-2727 (1992).

Liao,Q. et al., J. Electrochem. Soc., 144 (3), 936-943 (1997).

Sun,W.C. et al., "Thermal and electrical effects of partial shade in monolithic thin-film photovoltaic modules", ECS Electrochem. Lett., 4 (4), D5-D7 (2015).

Sun, W. C. et al. "Non-Vacuum Electroplated AI For N-Side Electrode in Solar Cells" Photovoltaic Specialist Conference (PVSC), 2014 IEEE 1oth, p. 2533-2537. IEEE, 2014.

Sun, W. C. et al. "Electroplating of Aluminum on Silicon in an Ionic Liquid" ECS Electrochemistry Letters. 2015.

Lennon, A. et al. "Evolution of Metal Plating for Silicon Solar Cells", Progress in Photovoltaics: Research and Applications, 21, p. 1454-1468 (2013).

Lee, E. J. et al. Sol. Energy Mater. Sol. Cells, 74 (1), 65-70 (2002).

Mette A. et al., "Photovoltaic Energy Conversion, Conference Record of the 2006 IEEE 4th World Conference on", vol. 1, p. 1056-1059. Ieee, 2006.

Bartsch,J. et al., J_ Appl. Electrochem., 40 (4), 757-765 (2010).

Jiang,T.et al., "Electrodeposition of aluminium from ionic liquids: Part 1-electrodeposition and surface morphology of aluminium from aluminium chloride (A1Cl3)-1-ethyl-3-methylimidazolium chloride ([EMim ]CI) ionic liquids", Surf. Coal. Technol., 201 (1-2), 1-9 (2006).

Jiang, T. et al., "Electrodeposition of aluminium from ionic liquids: Part II—studies on the electrodeposition of aluminum from aluminum chloride (AlCb)—trimethylphenylammonium chloride (TMPAC) ionic liquids",Surf. Coal. Technol., 201 (1-2), 10-18 (2006).

Leadbetter K. C., vol. Master. University of North Dakota, 2014.

U.S. Geological Survey, Mineral Commodity Summaries (2017).

Russell, R. et al., Proceedings of the 27th European Photovoltaic Solar Energy Conference and Exhibition (Frankfurt, 2012), p. 538.

Wang, L. et al., "2016 IEEE 43rd Photovoltaic Specialists Conference {PVSC)", p. 2986-2989, 2016.

Lai, P.K. et al J. Electroanol Chem. J. Electroanal. Chem., 248 (2), 431-440 (1988).

USPTO, Final Office Action dated Jul. 31, 2023 U.S. Appl. No. 17/725,855.

* cited by examiner

Al

Si

1100

Front & back diffusion $SiN_x/Al_2O_3$ coating

Front metallization

Back metallization n wafer (b)

Electroplated Al $SiN_x/Al_2O_3$ coating $p^+$ front emitter n base $n^+$ back surface field Al (a)

Electroplated Al

SiN$_x$ coating n$^+$ front emitter    p base p$^+$ back surface field

Al    Al

Al$_2$O$_3$ or SiO$_2$ (a)

Front & back diffusion

SiN$_x$ & Al$_2$O$_3$ coating

Back metallization

Front metallization p wafer (b)

SOLAR CELLS FORMED VIA ALUMINUM ELECTROPLATING

CROSS-REFERENCE TO RELATED APPLICATIONS

This application is a continuation of U.S. Ser. No. 16/432,702 filed on Jun. 5, 2019, now U.S. Patent Application Publication 2019-0312162 entitled "SOLAR CELLS FORMED VIA ALUMINUM ELECTROPLATING". U.S. Ser. No. 16/432,702 is a divisional of U.S. Ser. No. 15/079,359 filed on Mar. 24, 2016, now U.S. Patent Application Publication No. 2016-0204289 entitled "SOLAR CELLS FORMED VIA ALUMINUM ELECTROPLATING." U.S. Ser. No. 15/079,359 is a continuation of PCT Application No. PCT/US2014/067338 filed on Nov. 25, 2014 and entitled "SOLAR CELLS FORMED VIA ALUMINUM ELECTROPLATING." PCT Application No. PCT/US2014/067338 claims priority to, and the benefit of, U.S. Provisional Application Ser. No. 62/055,378 filed on Sep. 25, 2014 and entitled "SOLAR CELLS FORMED VIA ALUMINUM ELECTROPLATING," U.S. Provisional Application Ser. No. 62/018,320 filed on Jun. 27, 2014 and entitled "ALUMINUM ELECTROPLATING OF SOLAR CELLS," and U.S. Provisional Application Ser. No. 61/908,824 filed on Nov. 26, 2013 and entitled "SILICON PHOTOVOLTAIC SOLAR CELLS WITH ELECTROPLATED ALUMINUM ELECTRODES." Each of the above applications is hereby incorporated by reference in their entirety.

FEDERALLY SPONSORED RESEARCH OR DEVELOPMENT

This invention was made with government support under grant number DE-EE-0005322 awarded by the Department of Energy. The Government has certain rights in the invention.

TECHNICAL FIELD

The present disclosure relates to materials deposition, and in particular to electroplating of aluminum in connection with silicon solar cells.

BACKGROUND

Increasing expense and limited supply of silver has generated interest in alternative materials for use in connection with electrodes in silicon solar cells. However, common alternatives, such as copper, suffer from various drawbacks, for example a need for barrier layers, protective layers, and so forth. Accordingly, improved solar cells and methods related to fabrication of the same remain desirable.

SUMMARY

In an exemplary embodiment, a method for electroplating aluminum onto silicon comprises preparing an ionic liquid comprising aluminum chloride (AlCl3) and an organic halide (RX), the ionic liquid having a molar ratio of AlCl3: RX greater than 1; cleaning a silicon substrate with at least one of hydrogen fluoride, hydrogen chloride, hydrogen peroxide, or ammonium hydroxide; depositing aluminum onto the silicon substrate via an electroplating process incorporating the ionic liquid; cleaning the silicon substrate with alcohol and deionized water; and annealing the silicon substrate to reduce the resistivity of the electroplated aluminum.

In another exemplary embodiment, an n-type back-emitter solar cell comprises a front finger electrode comprising aluminum and formed by electroplating of aluminum onto silicon over a patterned SiNx layer, and a rear electrode comprising aluminum and formed by at least one of electroplating or screen printing. An electrical contact between the front finger electrode and the n-type front surface field of the solar cell is formed by firing at a temperature between about 100 degrees Celsius and about 500 degrees Celsius.

In another exemplary embodiment, an n-type back-emitter point-back-contact solar cell comprise a front finger electrode comprising aluminum electroplated over a patterned SiNx layer, and a rear electrode comprising aluminum over a layer of at least one of $SiO_2$ or $Al_2O_3$.

The contents of this section are intended as a simplified introduction to the disclosure, and are not intended to limit the scope of any claim.

BRIEF DESCRIPTION OF THE DRAWINGS

With reference to the following description and accompanying drawings:

FIG. 14 illustrates an n-type back-emitter point back contact silicon solar cell structure with an electroplated aluminum front electrode and a fabrication process utilizing one step diffusion in accordance with an exemplary embodiment;

DETAILED DESCRIPTION

Figure 1:
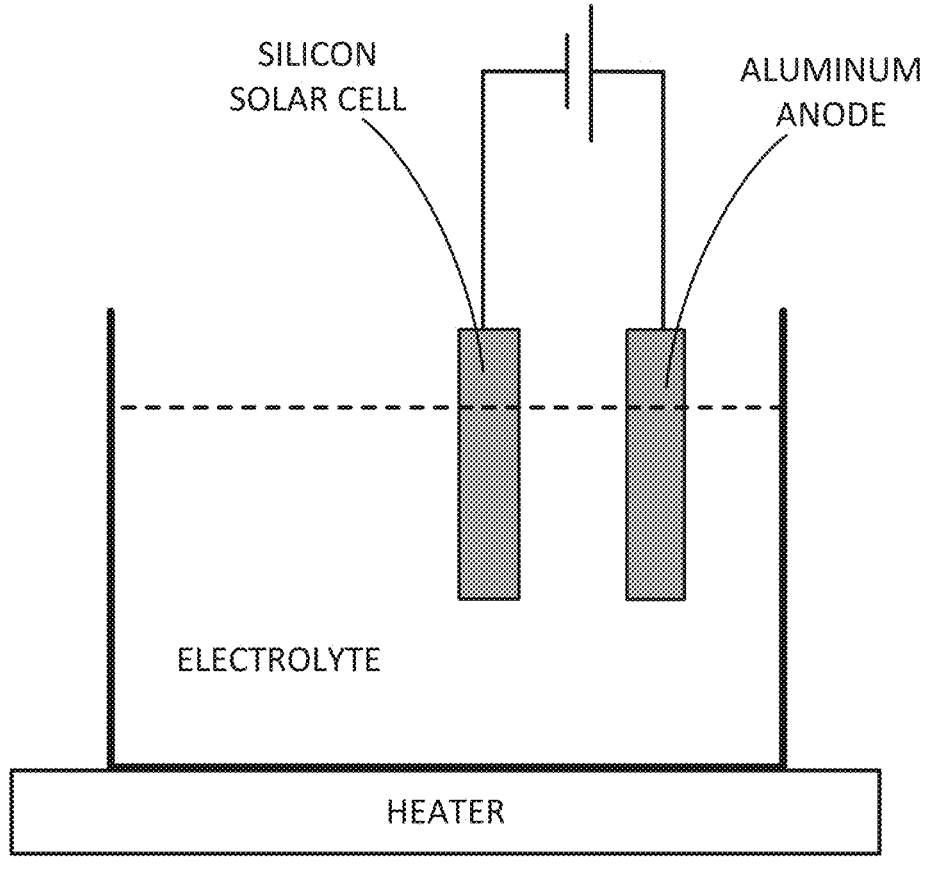
FIG. 1 illustrates a system for electroplating of aluminum in accordance with an exemplary embodiment.

The following description is of various exemplary embodiments only, and is not intended to limit the scope, applicability or configuration of the present disclosure in any way. Rather, the following description is intended to provide a convenient illustration for implementing various embodiments including the best mode. As will become apparent, various changes may be made in the function and arrangement of the elements described in these embodiments without departing from principles of the present disclosure.

For the sake of brevity, conventional techniques for materials deposition, electroplating, silicon solar cell fabrication, and the like may not be described in detail herein. Furthermore, the connecting lines shown in various figures contained herein are intended to represent exemplary functional relationships and/or physical couplings between various elements. It should be noted that many alternative or additional functional relationships or physical connections may be present in a practical silicon solar cell and/or method for electroplating of aluminum.

Prior solar cells suffer from various deficiencies. For example, many solar cells utilize silver for an electrode or electrodes. However, silver is increasing in expense and decreasing in availability. A common alternative, copper, requires barrier layers and/or protective layers, increasing complexity and cost. In contrast, these and other shortcomings of prior approaches may be overcome by utilizing principles of the present disclosure, for example as illustrated in various exemplary embodiments. For example, by utilizing electroplating of aluminum, silicon solar cells having acceptable performance (for example, power conversion efficiency above 15%) and reduced cost (for example, cost reductions of $0.1/W % p or greater) may be achieved.

The annual production of photovoltaic solar cells was ~30 GWp in 2012, with ~90% of them produced on silicon wafers. The front finger electrode in wafer-silicon solar cells is typically made of silver. Silver provides several advantages over other metals as the front finger electrode, such as low electrical resistivity and resistance to oxidation. However, there are a number of problems on the horizon for silver as an electrode in wafer-silicon solar cells. One is the rising price of silver, which fluctuated between $15 and $45 per ounce between summer 2010 and late 2014. During price peaks, it is estimated that the silver electrode adds up to ~$0.12/Wp to the cost of wafer-silicon solar cells. The fluctuating price also makes cost control difficult for solar cell manufacturers. Another problem is the limited reserve of silver on this planet. The known reserve of silver on this planet, according to U.S. Geological Survey, is about 540,000 metric tons. Several analyses have been published in the last few years about resource limitations to wafer-silicon solar cells due to the limited availability of silver. It is estimated that even if all the silver reserve were used exclusively for wafer-silicon solar cells, the total amount of energy these solar cells could produce would be limited to only about 1-2% of the projected energy demands in 2100.

In order to reduce the cost of wafer-silicon solar cells and enable large scale (for example, terawatt-scale) deployment, the silver electrode in wafer-silicon solar cells will desirably be replaced with a low-cost earth-abundant metal. Copper has been investigated extensively in recent years for this purpose, with industrial-type wafer-silicon solar cells with electroplated copper electrodes having been demonstrated with efficiency above 20%.

However, prior approaches have failed to suitably investigate aluminum as another metal candidate for this purpose. It is revealing to compare copper and aluminum as possible substitutes for silver in wafer-silicon solar cells. The biggest advantage of copper is its low resistivity, which is almost the same as that of silver. In comparison, the resistivity of aluminum is ~75% higher than silver. Typically, to reduce the resistive loss in an aluminum finger electrode, either a denser aluminum layer or a higher aspect ratio has to be achieved for the aluminum finger. On the other hand, there are several advantages of aluminum over copper as an electrode in wafer-silicon solar cells. Aluminum can be placed in direct contact with silicon as an electrode. In contrast, copper in direct contact with silicon is detrimental to the electrical properties of silicon, resulting in reduced efficiencies in wafer-silicon solar cells. For copper to serve as an electrode on silicon, a barrier layer (such as nickel) is typically placed between copper and silicon to prevent copper from going into the silicon.

Moreover, oxidation of aluminum forms a dense protective aluminum oxide layer on the surface of aluminum, which prevents further oxidation of the underneath aluminum and makes aluminum electrodes stable over long terms and in all kinds of weather. In contrast, copper is more readily oxidized, especially in humid climates, making long-term reliability a concern for copper electrodes. A protective layer, such as tin, is often required to cover a copper electrode and improve its reliability. The barrier layer and the protective layer for copper, which are not required for aluminum, make the process more complicated and the cost higher for copper electrodes than aluminum electrodes.

Prior approaches to utilize aluminum typically relied on expensive vacuum evaporation. In contrast, principles of the present disclosure contemplate wafer-silicon solar cell structures which are compatible with electroplated aluminum, for example as the front finger electrode. The back electrode may also be made of aluminum, which can be either electroplated or screen-printed. No silver is used as an electrode in these exemplary solar cell structures. The electroplating bath for aluminum may be an ionic liquid, or an organic solvent, or any suitable electroplating bath and/or process with a process temperature below 500° C. The electroplating process can be carried out in air or in dry air at a temperature between about 100° C. and 500° C. Moreover, the aluminum electrodes are in direct contact with silicon, both to n-type and p-type silicon. By replacing silver with aluminum in these solar cells, the cost of the cells may be reduced by up to $0.1/Wp or more, while the cells maintain a good efficiency above 15%. Accordingly, solar cells configured in accordance with principles of the present disclosure enable large-scale (for example, terawatt-scale) deployment of wafer-silicon solar cells at a significantly lower cost.

Figure 2:
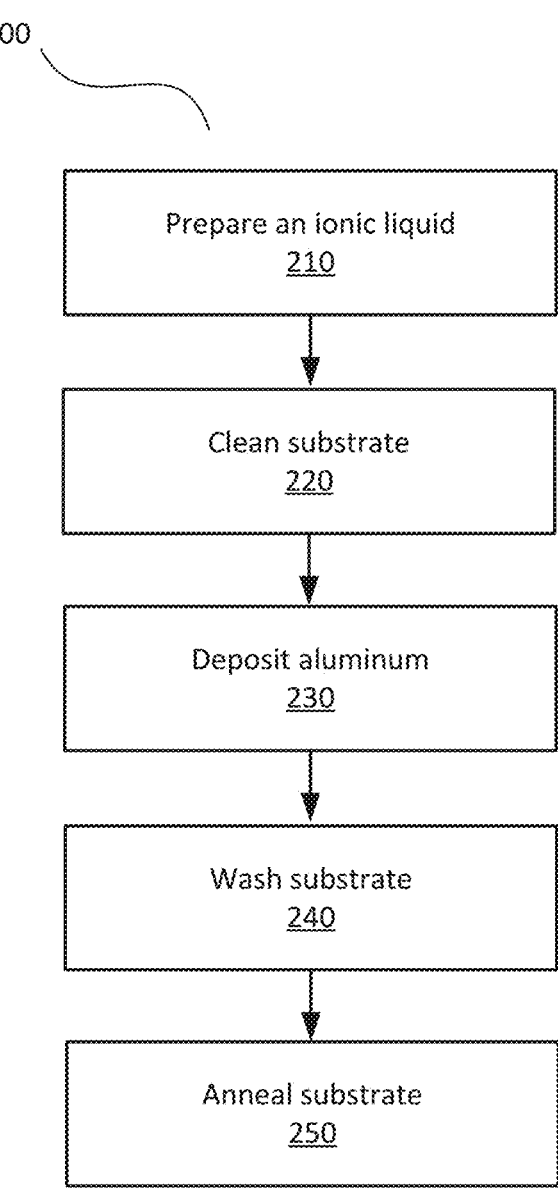
FIG. 2 illustrates a method for electroplating of aluminum in accordance with an exemplary embodiment.
Figure 3A:
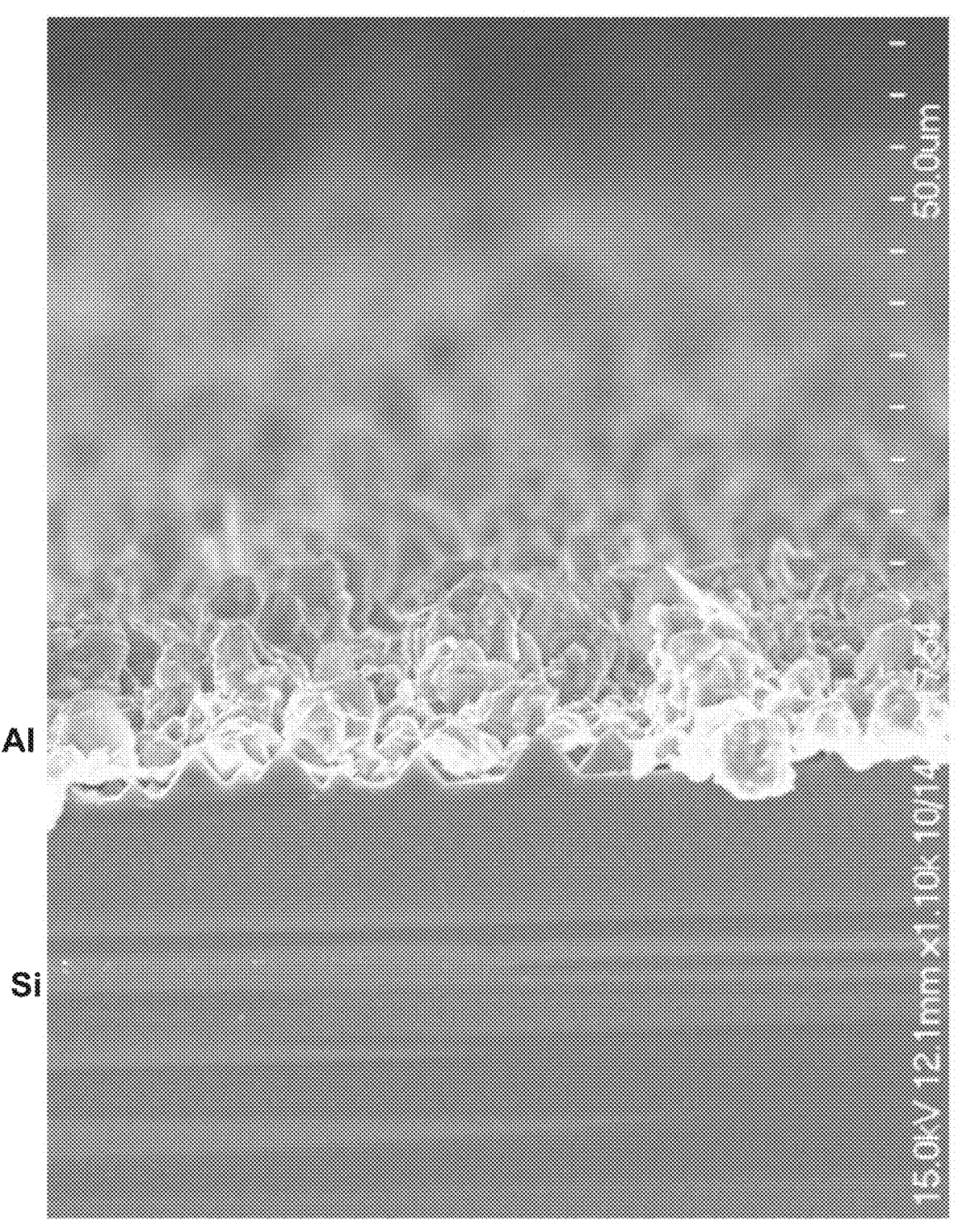
FIG. 3A is a cross-sectional scanning electron micrograph (SEM) image of electroplated aluminum on a textured n-type silicon(100) wafer in accordance with an exemplary embodiment.
Figure 3B:
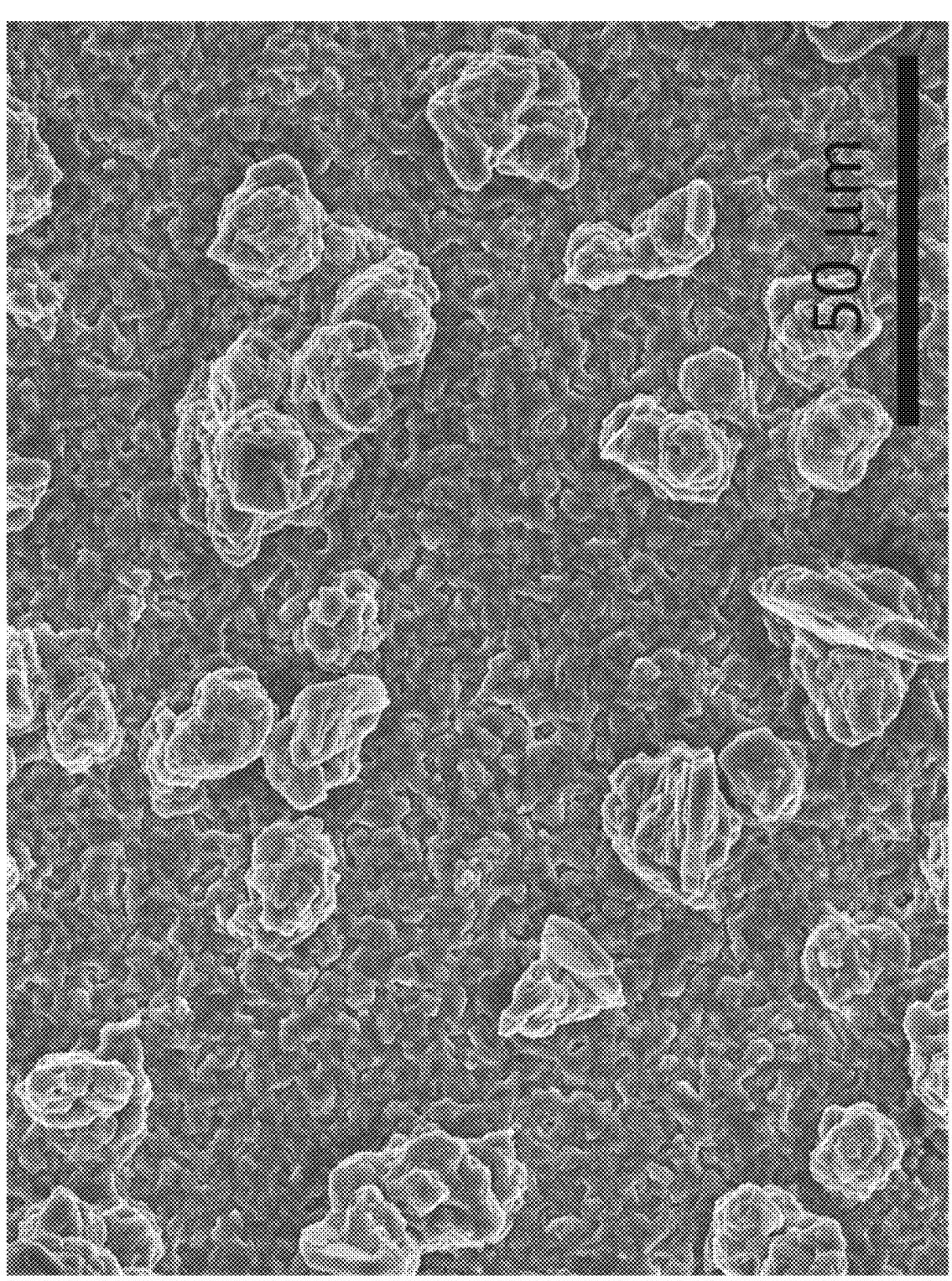
FIG. 3B is a top-view SEM image of electroplated aluminum on a silicon wafer in accordance with an exemplary embodiment.
Figure 4A:
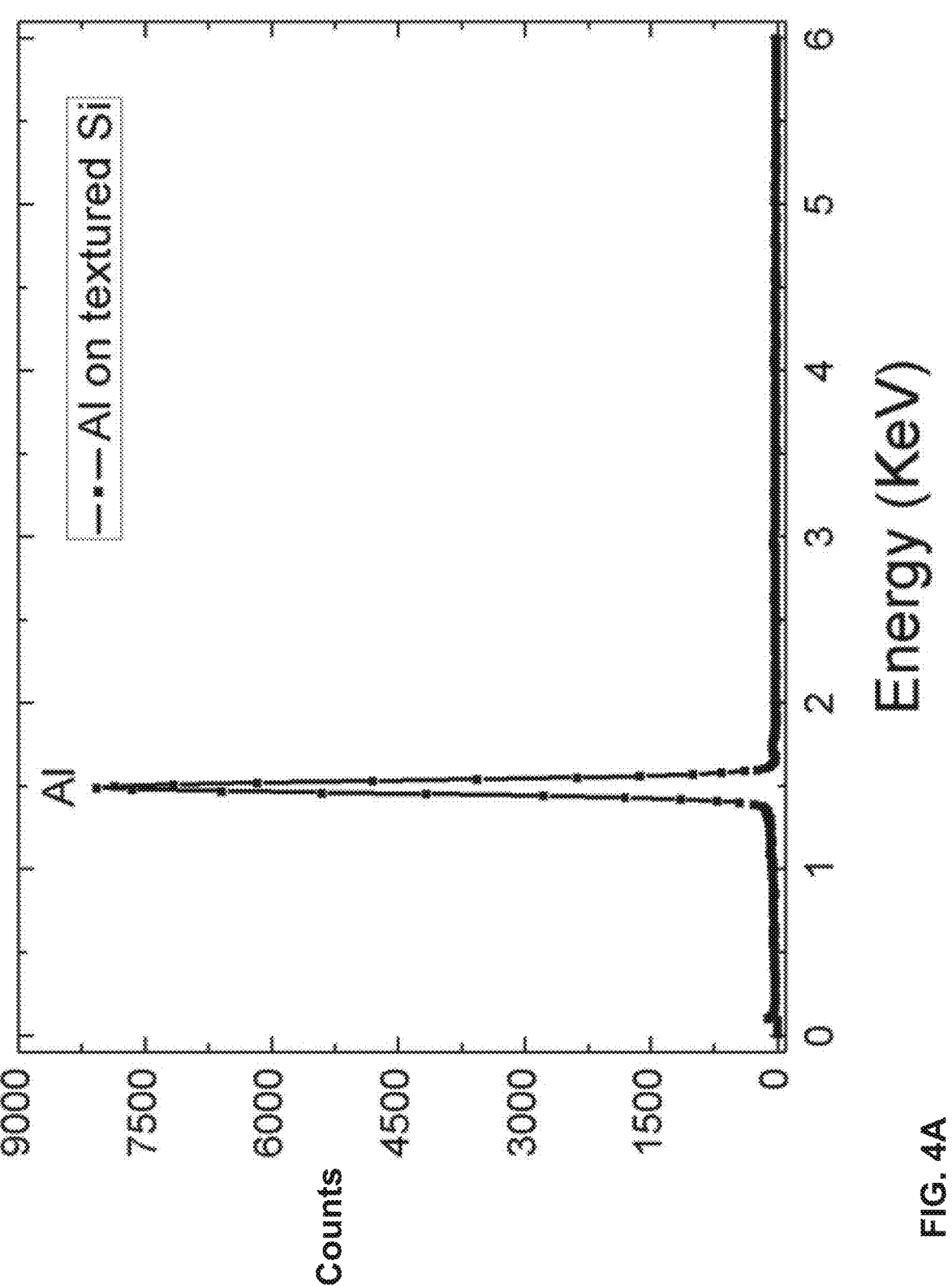
FIG. 4A is an energy-dispersive X-ray spectroscopy (EDX) spectrum of electroplated aluminum on a textured n-type silicon(100) wafer in accordance with an exemplary embodiment.
Figure 4B:
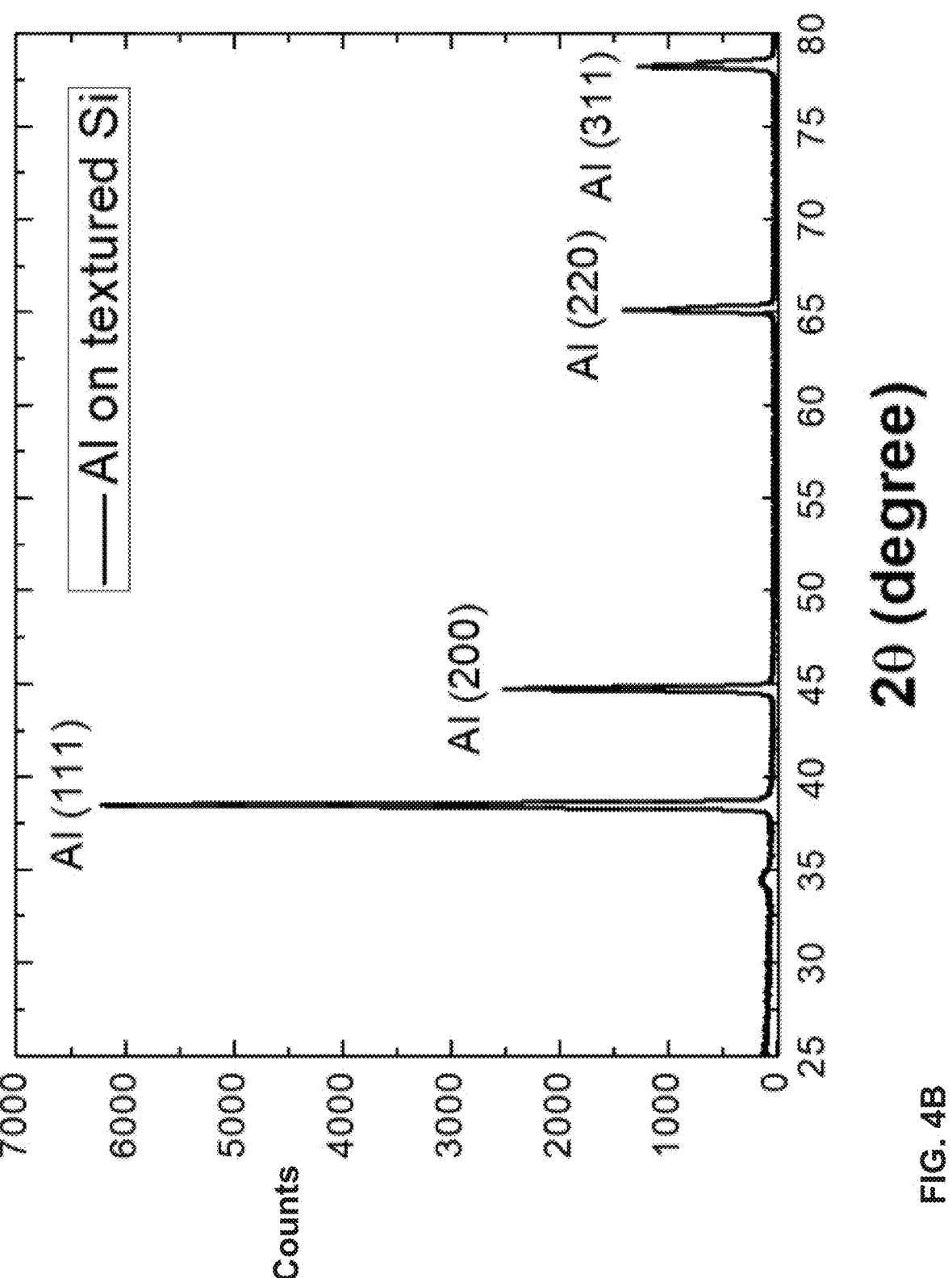
FIG. 4B is an X-ray diffraction (XRD) pattern of electroplated aluminum on a silicon wafer in accordance with an exemplary embodiment.
Figure 5:
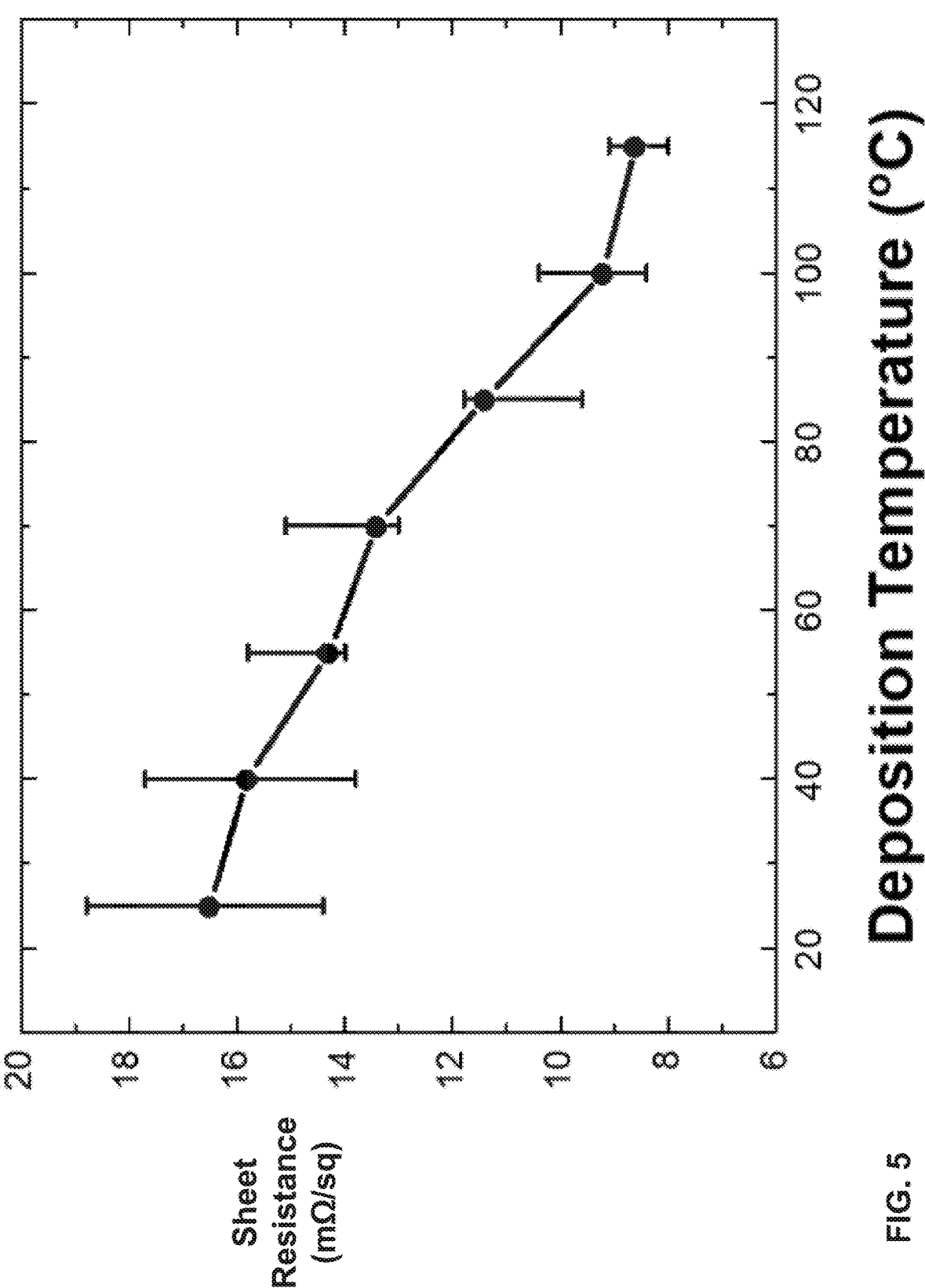
FIG. 5 illustrates sheet resistance of electroplated aluminum on textured n-type silicon(100) wafers as a function of deposition temperature in accordance with an exemplary embodiment.

In an exemplary embodiment, with initial reference to FIGS. 1 and 2, electroplating of aluminum on silicon wafers in a near-room-temperature ionic liquid is utilized to make electrodes on silicon solar cells. Compared to other electroplating techniques for aluminum, such as molten salts or organic aprotic solvents, room-temperature ionic liquids are a relatively new class of compounds characterized by high electrical conductivity, extremely low vapor pressure, low viscosity, low toxicity, non-flammability, high thermal and chemical stability, wide electrochemical window, and being liquid in a wide range of temperature, which make ionic liquids ideal solvents for electroplating of aluminum.

Typical ionic liquids are mixtures of aluminum chloride ($Al_1Cl_3$) and an organic halide (RX), such as 1-ethyl-3-methylimidazolium chloride (EMIC), 1-butyl-3-methylimidazolium chloride (BMIC), 1-methyl-3-ethylimidazolium chloride (MEIC), ethyl-pyridinium bromide (EPB), n-(n-butyl) pyridinium chloride (BPC), and the like. These ionic liquids exhibit adjustable Lewis acid-base properties, which vary with the molar ratio of $AlC_3$:RX. Ionic liquids with the molar ratio of $AlC_3$:RX>1 are acidic, and aluminum electroplating can be performed only under acidic conditions, in which the electroactive $Al_2Cl_7^-$ is reduced by the following reaction resulting in aluminum deposition:

$$4Al_2Cl_7^- + 3e^- \rightarrow Al + 7AlCl_4^-$$

Advantageously, in various exemplary embodiments a suitable ionic liquid is easy to prepare and relatively simple to handle under dry air, which prevents the ionic liquid from reacting with water. In various exemplary embodiments, the ionic liquid may be prepared and aluminum electroplating may be conducted both in a glove box with flowing dry nitrogen ($N_2$). 1-ethyl-3-methylimidazolium tetrachloroaluminate ([EMIM]$AlCl_4$) and anhydrous $AlC_3$ powder may be utilized.

In various exemplary embodiments, an ionic liquid is prepared by mixing proper quantities of $AlCl_3$ and [EMIM]$AlCl_4$ in a suitable container, for example a dry 50 ml beaker, at or near ambient temperature. The molar quantity of $AlCl_3$ is desirably larger than that of (EMIM)$AlCl_4$ to enable aluminum deposition from the ionic liquid. After mixing, a pre-bake may be performed in which the obtained electrolyte is heated to a suitable temperature, for example between about 100° C. and about 200° C., for a suitable time, for example between about 30 minutes and about 90 minutes, in order to further drive out residual moisture in the electrolyte. Then, the temperature of the electrolyte is changed to a predetermined temperature for the electroplating, for example between about 20° C. and about 200° C., and more specifically between about 100° C. and about 150° C. The electrolyte may be utilized without further purification.

In various exemplary embodiments, a two-electrode electrochemical cell may be employed to carry out electroplating. In other exemplary embodiments, a three-electrode electrochemical cell may be used. A textured silicon wafer, either n-type or p-type, with resistivity between 0.3-10 ohms-cm may be used as the cathode (2-electrode cell) or counter electrode (3-electrode cell). Prior to electroplating, the silicon wafer may be dipped in diluted hydrofluoric acid (HF) to remove native oxide. Aluminum wires of suitable purity, for example 99.99% purity, may be used as the anode (2-electrode cell) or working and reference electrodes (3-electrode cell). The aluminum electrode is utilized as a sacrificial electrode. Electrodes may be cleaned with a short dip in 37% hydrochloric acid (HCl), followed by a deionized water rinse. After the cleaning, electrodes may be assembled and then transferred to a dry nitrogen glove box or other suitable working location. A schematic of an exemplary electroplating system is illustrated in FIG. 1.

In various exemplary embodiments, deposition of aluminum may be performed at room temperature or slightly above room temperature, or more broadly, between about 20° C. and about 200° C. The electrolyte may be stirred, for example at a constant speed. A suitable electroplating technique may be utilized, for example galvanostatic electrolysis having a current of between about 10 mA/cm$^2$ and about 20 mA/cm$^2$ (and preferably, about 15 mA/cm$^2$). In some exemplary embodiments, a thin seed layer of nickel or titanium may be deposited first, before aluminum electroplating, to reduce the resistance of the silicon wafer, which helps aluminum electroplating.

In various exemplary embodiments, post-deposition cleaning of the silicon wafer is desirable. After each deposition, excess ionic liquid may be removed from the silicon wafer by washing in alcohol. Then, the wafer may be rinsed, for example with deionized water, and dried, for example with nitrogen. Post-deposition annealing under different ambient conditions, for example from vacuum to dry nitrogen to air, and between about 200° C. and about 450° C., may also be conducted to further reduce the resistivity of the electroplated aluminum.

In various exemplary embodiments, pre-deposition cleaning of the silicon wafer may be desirable. For example, the wafer may be cleaned with one or more of hydrogen fluoride, hydrogen chloride, hydrogen peroxide, ammonium hydroxide, and/or the like or mixtures of the same.

In various exemplary embodiments, pre-electroplating deposition of a layer of nickel, titanium, and/or the like on the silicon wafer, for example a layer having a thickness of between about 50 nanometers and about 500 nanometers, may be desirable to reduce the resistance of the silicon wafer and/or to facilitate adhesion of aluminum.

It will be appreciated that after multiple electroplating runs, the concentration of aluminum in the electrolyte remains largely unchanged, because the aluminum electrode continuously supplies aluminum ions to the electrolyte during deposition. In this manner, the electrolyte may be reused multiple times, provided it was stored under dry nitrogen such as in a dry nitrogen glove box, making the electroplating process more environmentally friendly.

Characterization of exemplary aluminum devices constructed in accordance with principles of the present disclosure are illustrated in FIGS. 3A-5.

In various exemplary embodiments, with reference again to FIG. 2, a method for electroplating of aluminum on a silicon substrate comprises preparing an ionic liquid (step 210); cleaning a silicon substrate (step 220); depositing aluminum via a two-electrode or three-electrode cell incorporating the ionic liquid (step 230); washing the silicon substrate with alcohol and/or deionized water (step 240); and annealing the silicon substrate to reduce the resistivity of the deposited aluminum (step 250).

Figure 6:
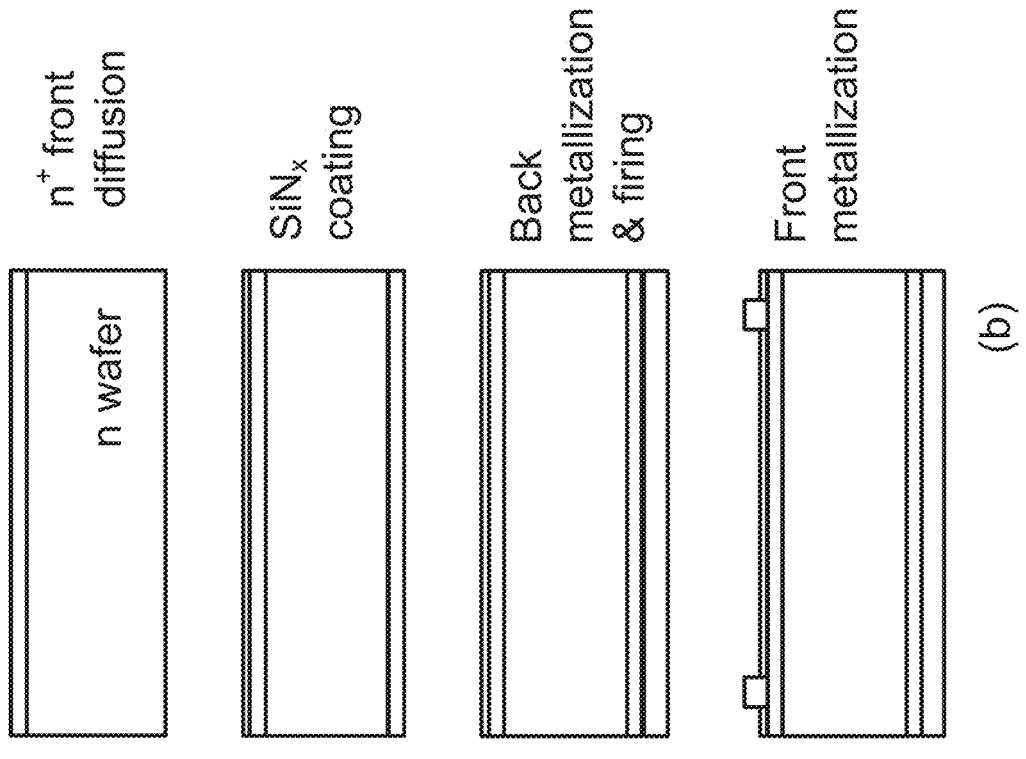
FIG. 6 illustrates a n-type back-emitter silicon solar cell structure with an electroplated aluminum front electrode and a fabrication process utilizing one step diffusion in accordance with an exemplary embodiment.
Figure 6:
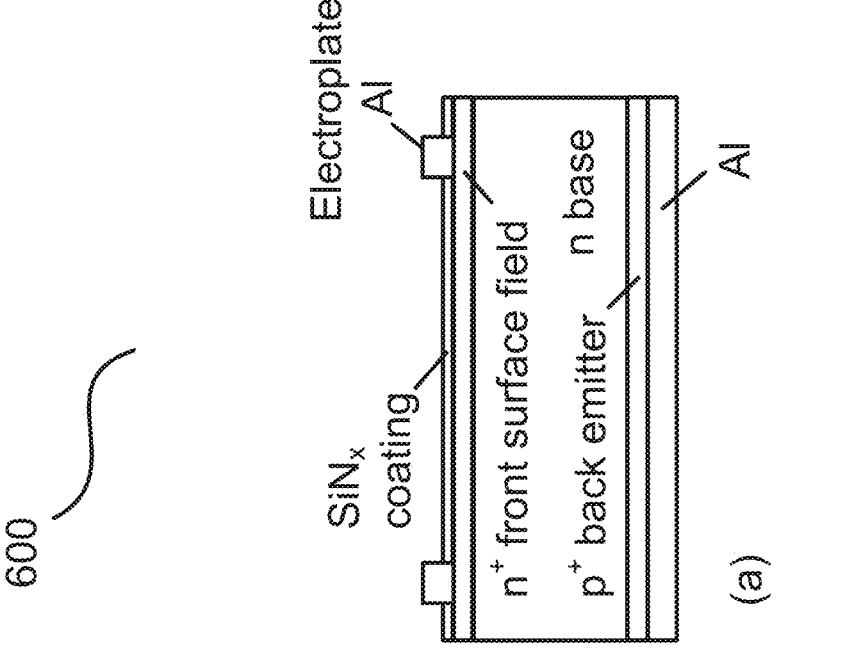
Figure 7:
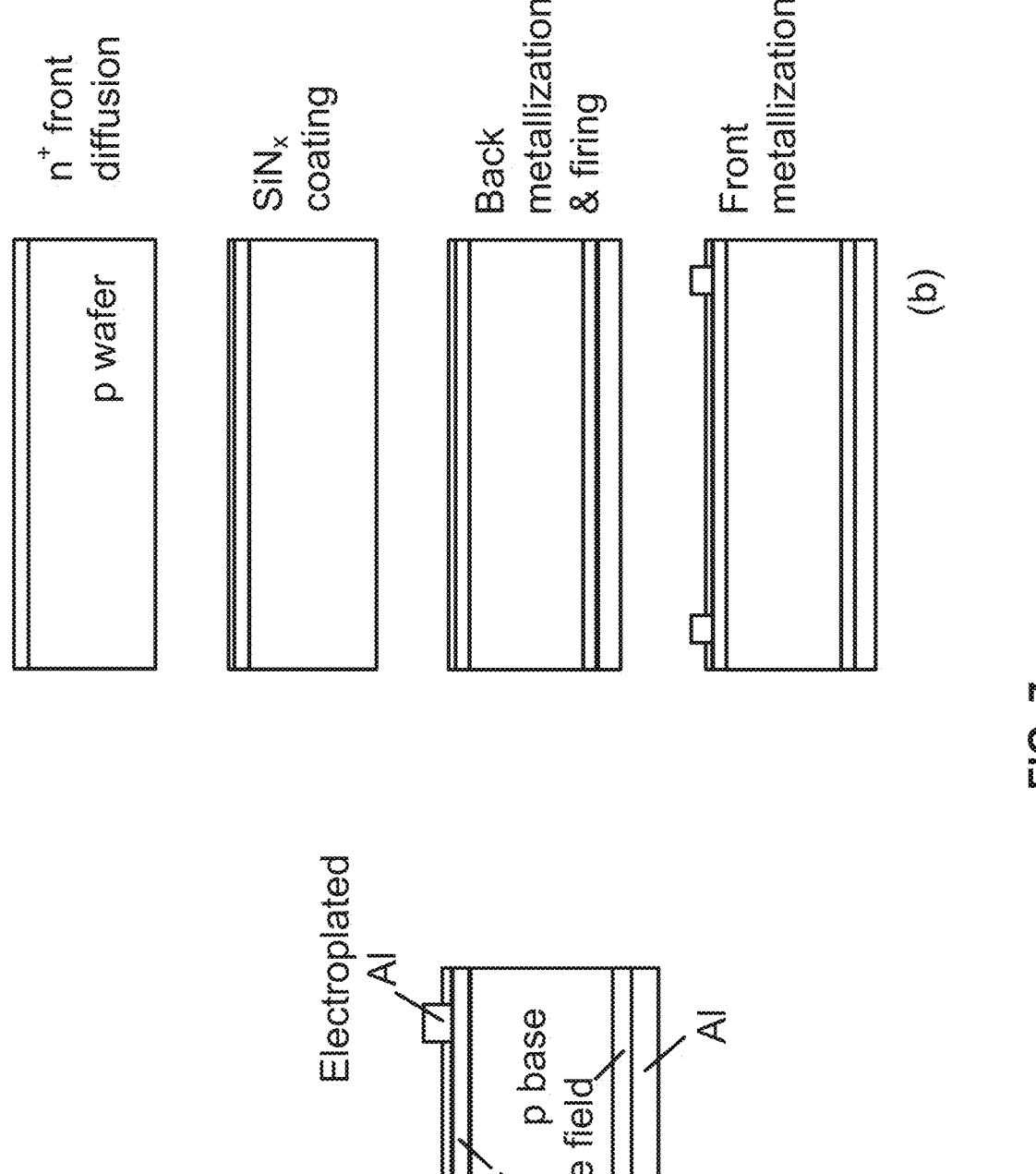
FIG. 7 illustrates a p-type front-emitter silicon solar cell structure with an electroplated aluminum front electrode and a fabrication process utilizing one step diffusion in accordance with an exemplary embodiment.
Figure 8:
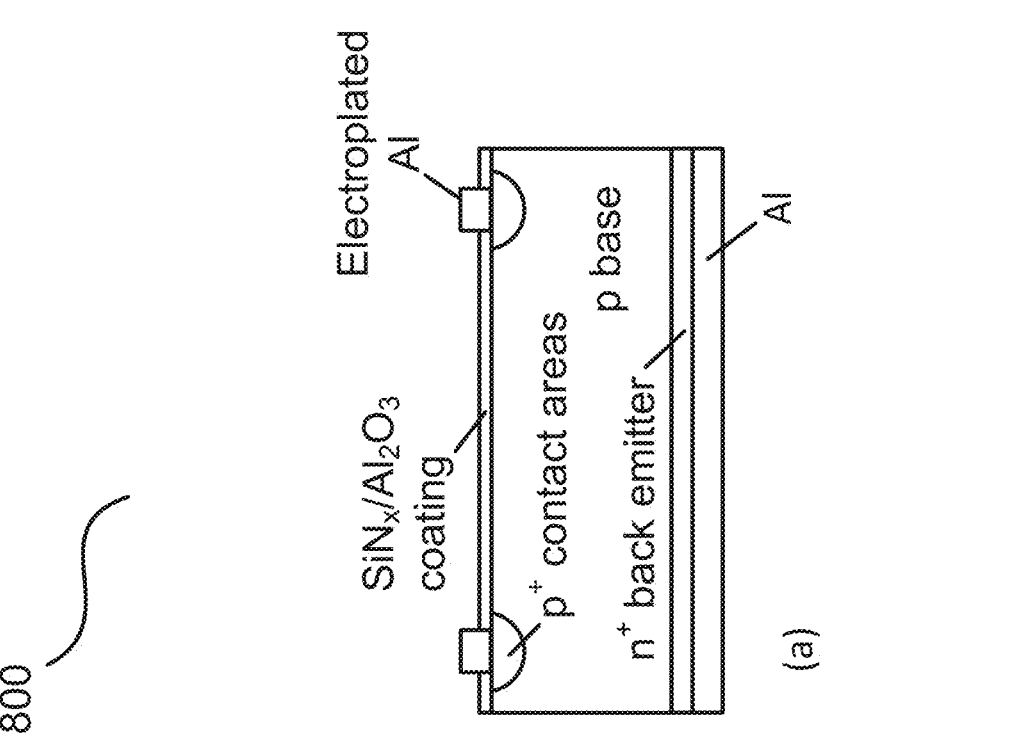
FIG. 8 illustrates a p-type back-emitter silicon solar cell structure with an electroplated aluminum front electrode and a fabrication process utilizing one step diffusion in accordance with an exemplary embodiment.

Principles of the present disclosure contemplate wafer-silicon solar cell structures which are compatible with electroplated aluminum, for example as the front finger electrode. The back aluminum electrode can be electroplated or screen-printed. Certain exemplary cell structures are schematically illustrated in FIGS. 6-12. Exemplary fabrication sequences are also illustrated in the figures. Three of these cell structures involve a fabrication sequence with one diffusion step and two metal firing and/or annealing steps (FIGS. 6-8). Four of these cell structures involve a fabrication sequence with two diffusion steps and one metal annealing step (FIGS. 9-12). Exemplary cell structures include both n-type cells (FIGS. 6, 9, 11) and p-type cells (FIGS. 7, 8, 10, 12).

With reference now to FIG. 6, in an exemplary embodiment an n-type back-emitter cell 600 with one diffusion step may be formed. Exemplary features of this cell 600 include: 1. The silicon wafer is n-type with an appropriate dopant (typically phosphorus) and an appropriate doping concentration (typically about $1\times10^{16}$ cm$^{-3}$); 2. Phosphorus or arsenic is diffused into the front side to form an n+ front surface field with an appropriate doping profile, i.e. an appropriate surface doping concentration (typically above $1\times10^{9}$ cm$^{-3}$) and an appropriate depth (typically ~1 micrometer); 3. The back aluminum electrode is fired at ~750° C., resulting in the p+ back-emitter with an appropriate doping concentration (typically above $1\times10^{19}$ cm$^{-3}$) and an appropriate depth (typically ~10 micrometers); 4. On the front side, aluminum doping into the n-type silicon is prevented by low-temperature annealing of the front aluminum electrode; and 5. The front silicon surface is coated with a layer of silicon nitride for antireflection.

In various exemplary embodiments, with continued reference to FIG. 6, FIG. 6(*b*) illustrates an exemplary fabrication sequence for the cell 600 structure in FIG. 6(*a*). It involves two metal firing and/or annealing steps and one diffusion step. The two metal firing/annealing steps form the front and back electrodes separately. The fabrication sequence starts with an n-type silicon wafer, monocrystalline or multicrystalline, with an appropriate phosphorus doping level. After surface texturing and cleaning, the diffusion on the front side of the wafer forms an n+ front surface field with an appropriate doping level and an appropriate depth. The more popular dopant for the front surface field is phosphorus, but arsenic can also be used for the front surface field. A layer of silicon nitride is deposited on the front side of the wafer after diffusion (for example, by plasma-enhanced chemical vapor deposition). Aluminum metallization on the backside is performed first. This can be realized by either electroplating, as contemplated in accordance with principles of the present disclosure, or screen printing as is known in the art. After the back aluminum electrode is formed and before the front finger electrode is fabricated, the silicon wafer is heated to a suitable temperature (typically ~750° C.) to fuse aluminum into silicon. This forms a layer of high aluminum concentration on the backside of the silicon wafer, which is the p+ emitter of the cell.

After the high temperature firing, the front silicon nitride layer is patterned for the front finger electrode. The patterning can be realized by laser ablation, photolithography, or any other suitable patterning technique. Electroplating of aluminum is then performed for the front side of the wafer, as described herein. The silicon wafer is then heated to a moderate temperature, which is typically between 100° C. and 500° C., for the formation of the front electrical contact. The lower annealing temperature for the front electrode prevents aluminum from doping the front side n-type silicon. After the second metal annealing step, the cell is completed.

With reference now to FIG. 7, in various exemplary embodiments, principles of the present disclosure contemplate a p-type front-emitter cell 700 with one diffusion step. Exemplary features of this cell 700 include: 1. The silicon wafer is p-type with an appropriate dopant (typically boron) and an appropriate doping concentration (typically about $1\times10^{16}$ cm$^{-3}$); 2. Phosphorus or arsenic is diffused into the front side to form the n-type emitter with an appropriate doping profile, i.e. an appropriate surface doping concentration (typically above $1\times10^{19}$ cm$^{-3}$) and an appropriate depth (typically ~1 micrometer); 3. The back aluminum electrode is fired at ~750° C., resulting in a p+ back surface field with an appropriate doping concentration (typically above $1\times10^{19}$ cm$^{-3}$) and an appropriate depth (typically ~10 micrometers); 4. On the front side, aluminum doping into the n-type silicon is prevented by low temperature annealing of the front aluminum electrode; and 5. The front silicon surface is coated with a layer of silicon nitride for antireflection.

In various exemplary embodiments, with continued reference to FIG. 7, FIG. 7(*b*) illustrates an exemplary fabrication sequence for the cell 700 structure in FIG. 7(*a*). This process sequence is similar to the process sequence for the cell 600 structure in FIG. 6(*a*). It involves two metal firing and/or annealing steps and one diffusion step. The two metal firing/annealing steps form the front and back electrodes separately. The fabrication sequence starts with a p-type silicon wafer, monocrystalline or multicrystalline, with an appropriate boron doping level. After surface texturing and cleaning, the diffusion on the front side of the wafer forms the n-type emitter with an appropriate doping level and an appropriate depth. The more popular dopant for the front emitter is phosphorus, but arsenic can be used for the front emitter. A layer of silicon nitride is deposited on the front side of the wafer after diffusion, for example by plasma-enhanced chemical vapor deposition. Aluminum metallization on the backside is performed first. This can be realized by either electroplating, as contemplated in accordance with principles of the present disclosure, or screen printing as is known in the art. After the back aluminum electrode is formed and before the front finger electrode is fabricated, the silicon wafer is heated to a suitable temperature (typically ~750° C.) to fuse aluminum into silicon. This forms a layer of high aluminum concentration on the backside of the silicon wafer, which is the p+ back surface field of the cell.

After the high temperature firing, the front silicon nitride layer is patterned for the front finger electrode. The patterning can be realized by laser ablation, photolithography, or any other suitable patterning technique. Electroplating of aluminum is then performed for the front side of the wafer, as described herein. The silicon wafer is then heated to a moderate temperature, which is typically between 100° C. and 500° C., for the formation of the front electrical contact. The low annealing temperature for the front electrode prevents aluminum from doping the front side n-type silicon. After the second metal annealing step, the cell is completed.

Figure 9:
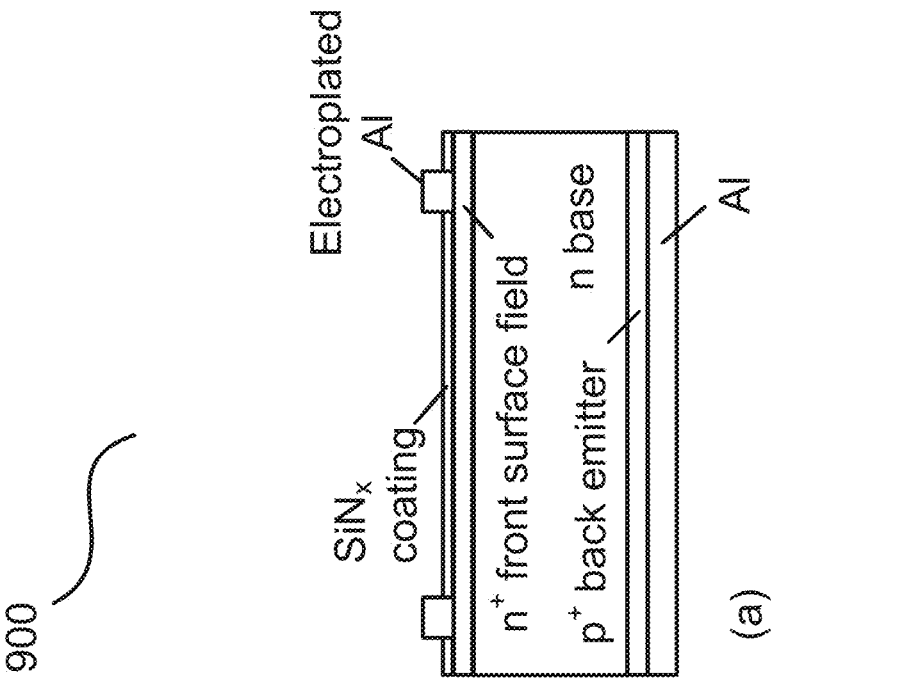
FIG. 9 illustrates a n-type back-emitter silicon solar cell structure with an electroplated aluminum front electrode and a fabrication process utilizing two step diffusion in accordance with an exemplary embodiment.

With reference now to FIG. 9, in accordance with various exemplary embodiments, principles of the present disclosure contemplate an n-type back-emitter cell 900 with one metal annealing step. Exemplary features of this cell include: 1. The silicon wafer is n-type with an appropriate dopant (typically phosphorus) and an appropriate doping concentration (typically about $1\times10^{16}$ cm$^{-3}$); 2. Phosphorus or arsenic is diffused into the front side to form a n+ front surface field with an appropriate doping profile, i.e. an appropriate surface doping concentration (typically above $1\times10^{19}$ cm$^{-3}$) and an appropriate depth (typically ~1 micrometer); 3. Boron is diffused into the backside to form the p+ back-emitter with an appropriate concentration (typically above $1\times10^{19}$ cm$^{-3}$) and an appropriate depth (typically ~1 micrometer); 4. The front silicon surface is coated with a layer of silicon nitride for antireflection; and 5. After formation of front and back aluminum electrodes, they are annealed together at a temperature below ~500° C., which prevents aluminum doping into the front side n-type silicon.

In various exemplary embodiments, with continued reference to FIG. 9, FIG. 9(b) illustrates an exemplary fabrication sequence for the cell 900 structure in FIG. 9(a). It involves two diffusion steps and one metal annealing step. The fabrication sequence starts with an n-type silicon wafer, monocrystalline or multicrystalline, with an appropriate phosphorus doping level. After surface texturing and cleaning, the diffusion on the backside of the wafer forms the p-type back-emitter with an appropriate doping level and an appropriate depth. The dopant for the back-emitter is boron. The diffusion on the front side of the wafer forms an n+ front surface field with an appropriate doping level and an appropriate depth. The more popular dopant for the front surface field is phosphorus, but arsenic can also be used for the front surface field. A layer of silicon nitride is deposited on the front side of the wafer after diffusion, for example by plasma-enhanced chemical vapor deposition.

Aluminum metallization can be performed in two steps. In two-step aluminum deposition, aluminum is deposited on the backside by screen printing or electroplating. In a second step, the front silicon nitride layer is patterned for the front finger electrode. The patterning can be realized by laser ablation, photolithography, or any other suitable patterning technique. Electroplating of aluminum is then performed for the front side of the wafer, as described herein. The silicon wafer is then heated to a moderate temperature, which is typically between 100° C. and 500° C., for the formation of the front and back electrical contacts. After metal annealing, the cell is completed.

Figure 10:
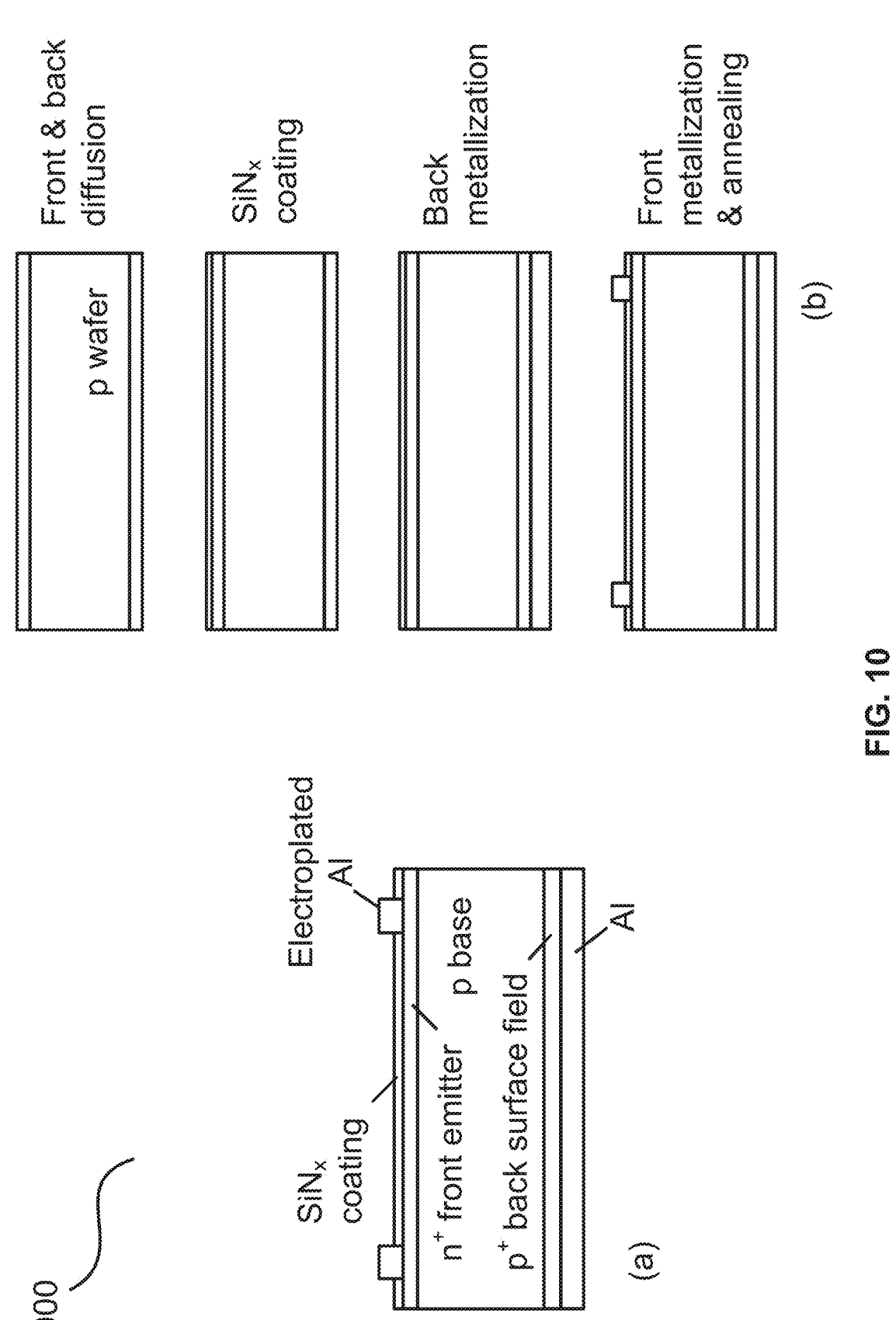
FIG. 10 illustrates a p-type front-emitter silicon solar cell structure with an electroplated aluminum front electrode and a fabrication process utilizing two step diffusion in accordance with an exemplary embodiment.

With reference now to FIG. 10, in various exemplary embodiments, for the cell 1000 structure illustrated in FIG. 10(a), the p-type front-emitter cell with one metal annealing step, its fabrication sequence is similar to the process sequence for the cell 900 structure in FIG. 9(a), except that it starts with a p-type silicon wafer.

Figure 11:
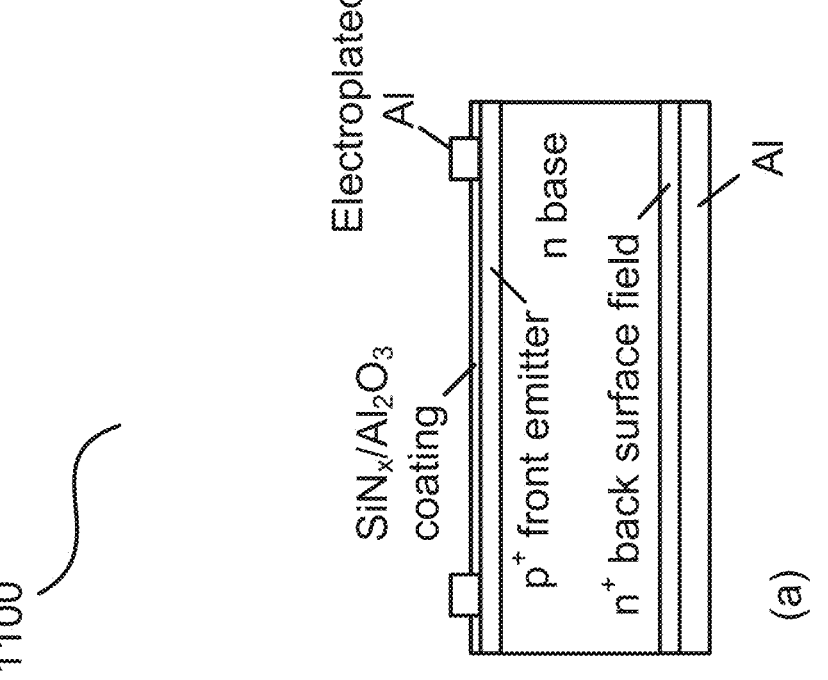
FIG. 11 illustrates a n-type front-emitter silicon solar cell structure with an electroplated aluminum front electrode and a fabrication process utilizing two step diffusion in accordance with an exemplary embodiment.

With reference now to FIG. 11, in accordance with various exemplary embodiments, principles of the present disclosure contemplate an n-type front-emitter cell 1100 with one metal annealing step. Exemplary features of this cell 1100 include: 1. The silicon wafer is n-type with an appropriate dopant (typically phosphorus) and an appropriate doping concentration (typically about $1\times10^{19}$ cm$^{-3}$); 2. Boron is diffused into the front side to form the p-type front emitter with an appropriate doping profile, i.e. an appropriate surface doping concentration (typically above $1\times10^{19}$ cm$^{-3}$) and an appropriate depth (typically ~1 micrometer); 3. Phosphorus or arsenic is diffused into the backside to form a n+ back surface field with an appropriate concentration (typically above $1\times10^{19}$ cm$^{-3}$) and an appropriate depth (typically ~1 micrometer); 4. The front silicon surface is coated with a layer of aluminum oxide for surface passivation and then a layer of silicon nitride for antireflection; and 5. After formation of front and back aluminum electrodes, they are annealed together at a temperature below 500° C., which prevents aluminum doping into the backside n-type silicon.

In various exemplary embodiments, with continued reference to FIG. 11, FIG. 11(b) illustrates an exemplary fabrication sequence for the cell 1100 structure in FIG. 11(a). It involves two diffusion steps and one metal annealing step. The fabrication sequence starts with an n-type silicon wafer, monocrystalline or multicrystalline, with an appropriate phosphorus doping level. After surface texturing and cleaning, the diffusion on the front side of the wafer forms the p-type front emitter with an appropriate doping level and an appropriate depth. The dopant for the front emitter is boron. The diffusion on the backside of the wafer forms an n+ back surface field with an appropriate doping level and an appropriate depth. The more popular dopant for the back surface field is phosphorus, but arsenic can also be used for the back surface field. A layer of aluminum oxide is deposited on the front side after diffusion. A layer of silicon nitride is then deposited on top of aluminum oxide, for example by plasma-enhanced chemical vapor deposition.

Aluminum metallization can be performed in two steps. In a first step, the front aluminum oxide/silicon nitride stack is patterned for the front finger electrode. The patterning can be realized by laser ablation, photolithography, or any other suitable patterning technique. Electroplating of aluminum is then performed for the front side of the wafer, as described herein. In a second step, aluminum is deposited on the backside by screen printing or electroplating. The silicon wafer is then heated to a moderate temperature, which is typically between 100° C. and 500° C., for the formation of the front and back electrical contacts. After metal annealing, the cell is completed.

Figure 12:
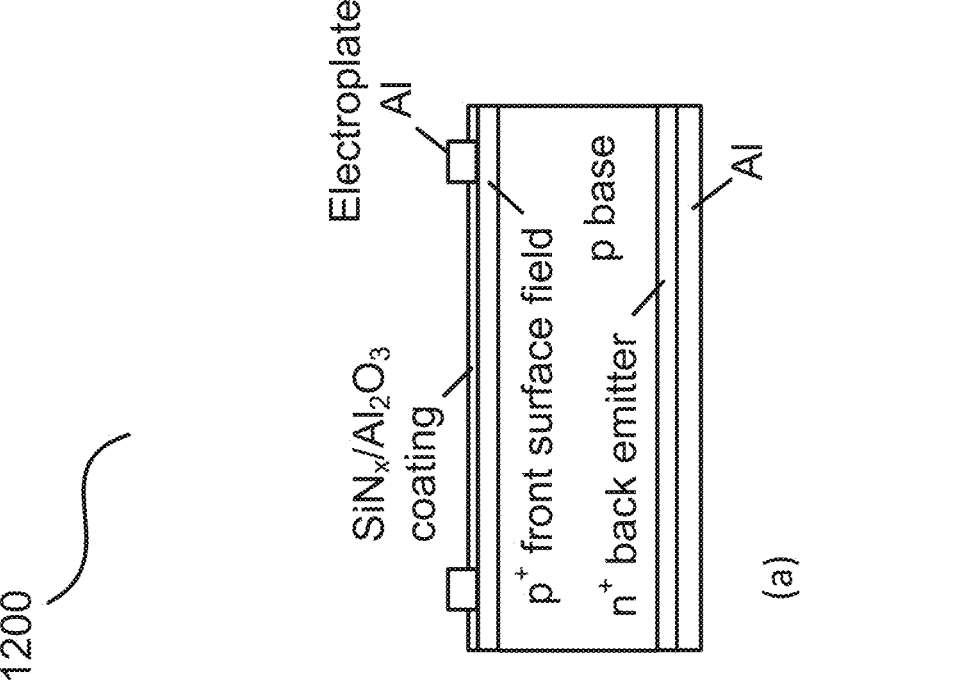
FIG. 12 illustrates a p-type back-emitter silicon solar cell structure with an electroplated aluminum front electrode and a fabrication process utilizing two step diffusion in accordance with an exemplary embodiment.

With reference now to FIG. 12, in various exemplary embodiments, for the cell 1200 structure illustrated in FIG. 12(a), the p-type back-emitter cell with one metal annealing step, its fabrication sequence is similar to the process sequence for the cell 1100 structure in FIG. 11(a), except that it starts with a p-type silicon wafer.

Figure 13:
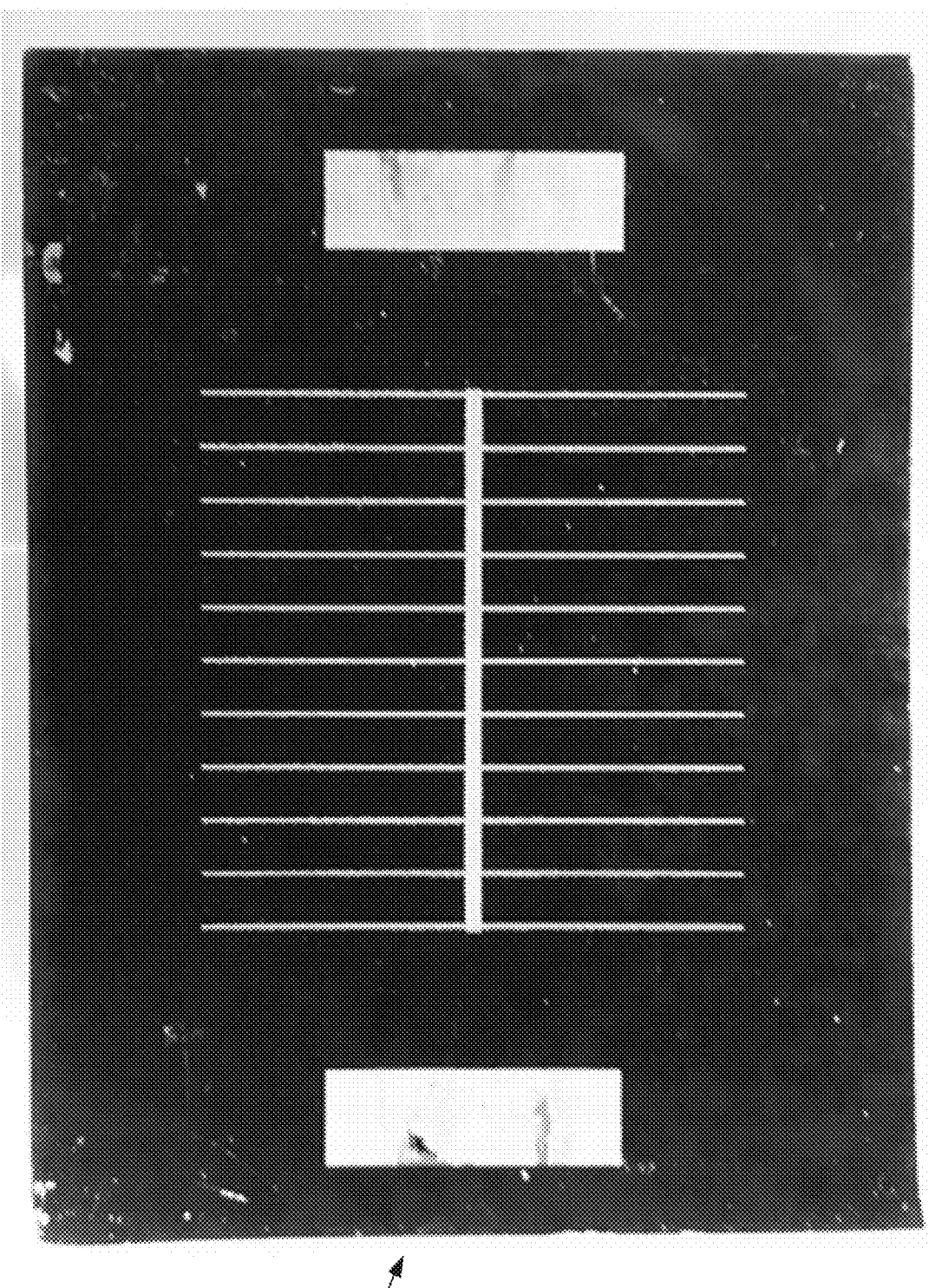
FIG. 13 is a photograph of an all-aluminum n-type back-emitter silicon solar cell, having a structure corresponding to FIG. 6 and with an electroplated aluminum front electrode and screen-printed aluminum back electrode in accordance with an exemplary embodiment.

With reference now to FIG. 13, in various exemplary embodiments, principles of the present disclosure contemplate fabrication of all-aluminum silicon solar cells such as cell 1300, for example utilizing an electroplated aluminum front electrode and a screen-printed aluminum back electrode. This is an n-type back-emitter cell as similarly illustrated in FIG. 6.

Turning now to FIGS. 14-17, in accordance with various exemplary embodiments, principles of the present disclosure contemplate solar cells configured with point contact for the backside electrode. Common features of such cells as described herein include:

the backside of the cells are p-type;

the backside aluminum electrode is screen printed;

the backside contact is confined by openings in an exemplary layer, for example an aluminum oxide (Al$_2$O$_3$) or silicon dioxide (SiO$_2$) layer;

the thickness of the Al$_2$O$_3$ or SiO$_2$ layer is between about 5 nm and about 50 nm;

the openings are formed by lithography or laser annealing;

the front side of the cells are n-type, and the front aluminum electrode is electroplated;

the n+ front side of the cells is realized through phosphorus diffusion, with the front surface phosphorus concentration in the range of about $1\times10^{19}$ cm$^{-3}$;

the front surface is coated with a layer of silicon nitride (SiN$_x$) with a thickness of between about 50 nm and about 100 nm; and the front side contact is made through openings in the SiN$_x$ layer, which are formed by lithography or laser ablation.

Figure 14:
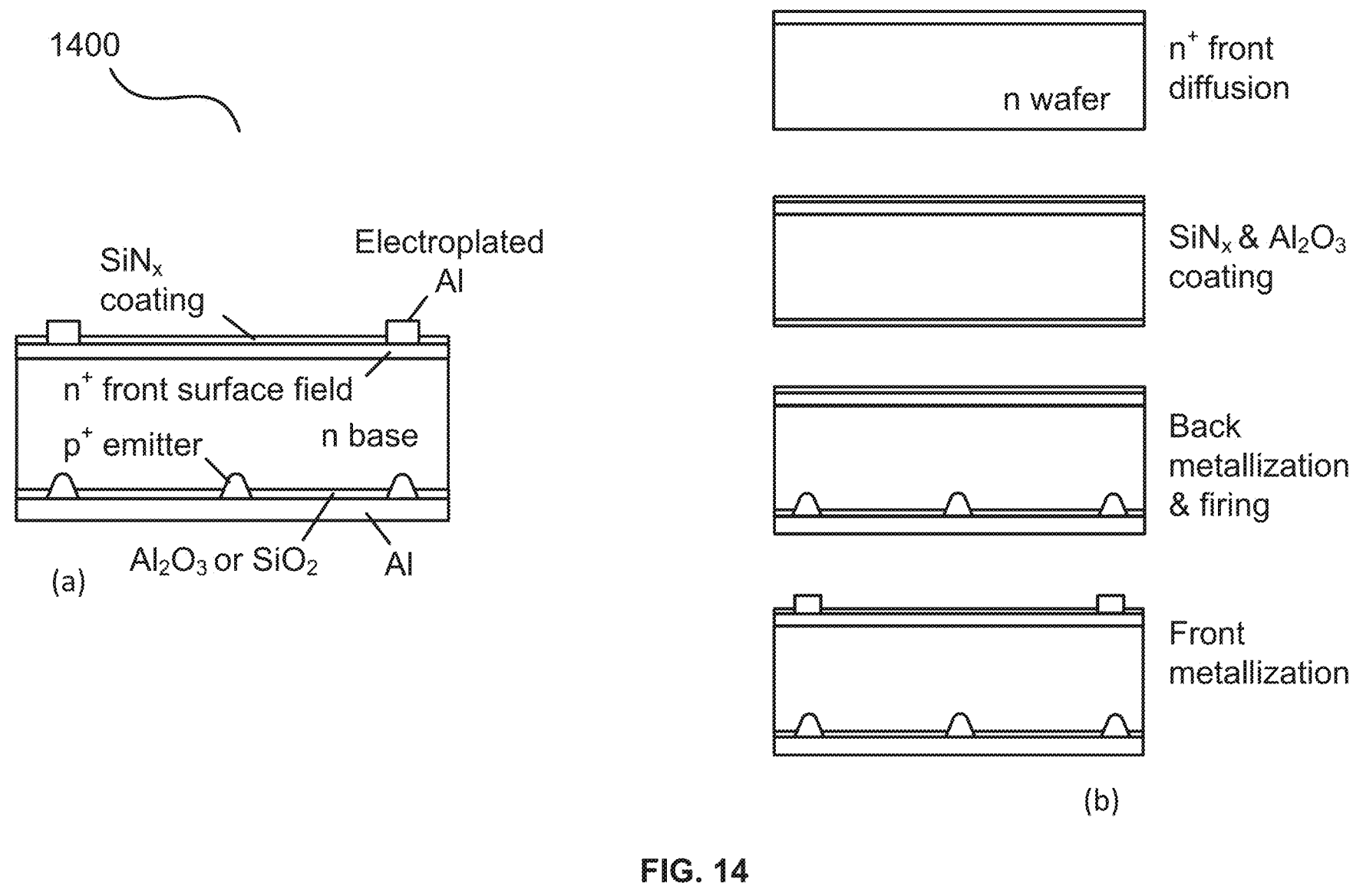

With specific reference to FIG. 14, in accordance with various exemplary embodiments, principles of the present disclosure contemplate an n-type back-emitter cell 1400 with point contact for the backside electrode. In this exemplary embodiment, the silicon wafer is n-type, with a resistivity between about 1 Ohm-cm and about 5 Ohms-cm. After cleaning and surface texturing, phosphorus is diffused into the front side of the wafer to a concentration of about $1\times10^{19}$ cm$^{-3}$. Phosphosilicate glass formed on the wafer during diffusion is removed.

In this exemplary embodiment, SiN$_x$ and Al$_2$O$_3$ coating is utilized. An about 50 nm to about 100 nm thick SiN$_x$ layer is deposited on the front side of the wafer (i.e., the phosphorus-diffused side), for example by plasma-enhanced chemical vapor deposition or the like. On the backside of the wafer, an about 5 nm to about 50 nm thick Al$_2$O$_3$ layer is deposited by atomic layer deposition. Alternatively, on the backside of the wafer, an about 5 nm to about 50 nm thick SiO$_2$ layer may be deposited via plasma-enhanced chemical vapor deposition, thermal oxidation, and/or the like. Moreover, the sequence of the front side SiN$_x$ layer and the backside SiO$_2$ or Al$_2$O$_3$ layer may be switched, as desired.

A suitable method may be utilized to form the backside contact. For example, laser annealing may be utilized. In this approach, an aluminum layer is screen-printed onto the backside of the wafer. After firing between about 550° C. and about 800° C. for the screen-printed aluminum, a laser may be utilized to locally heat the backside of the wafer through the aluminum layer. Laser annealing allows the aluminum layer to penetrate the SiO$_2$ or Al$_2$O$_3$ layer, and forms a heavily-doped p+ region under the laser spot. An array of p+ regions may be created by moving the laser spot across the back surface; the regions provide a localized p+ emitter for the solar cell. Alternatively, lithographic patterning may be utilized to created holes in the SiO$_2$ or Al$_2$O$_3$ layer. An aluminum layer is then screen-printed on the patterned SiO$_2$ or Al$_2$O$_3$. The wafer is then fired at between about 600° C. and about 800° C. to form a localized p+ emitter in the cell.

Front metallization may be accomplished via a suitable method, for example laser ablation or lithography. In laser ablation, a laser is employed to remove SiN$_x$ from the contact area on the front side of the cell. In lithography, lithographic patterning is utilized to create openings in the SiN$_x$ layer. Aluminum electroplating may then be performed on the patterned SiN$_x$ layer, either directly on silicon or preferentially on a seed layer of nickel. When nickel is utilized, a nickel layer of between about 100 nm to about 400 nm is electroplated into the openings in the SiN$_x$ layer, and then an aluminum layer of between about 5 microns and about 25 microns is electroplated onto the nickel seed layer. A final annealing below 500° C. completes the fabrication process for the exemplary cell.

Figure 16:
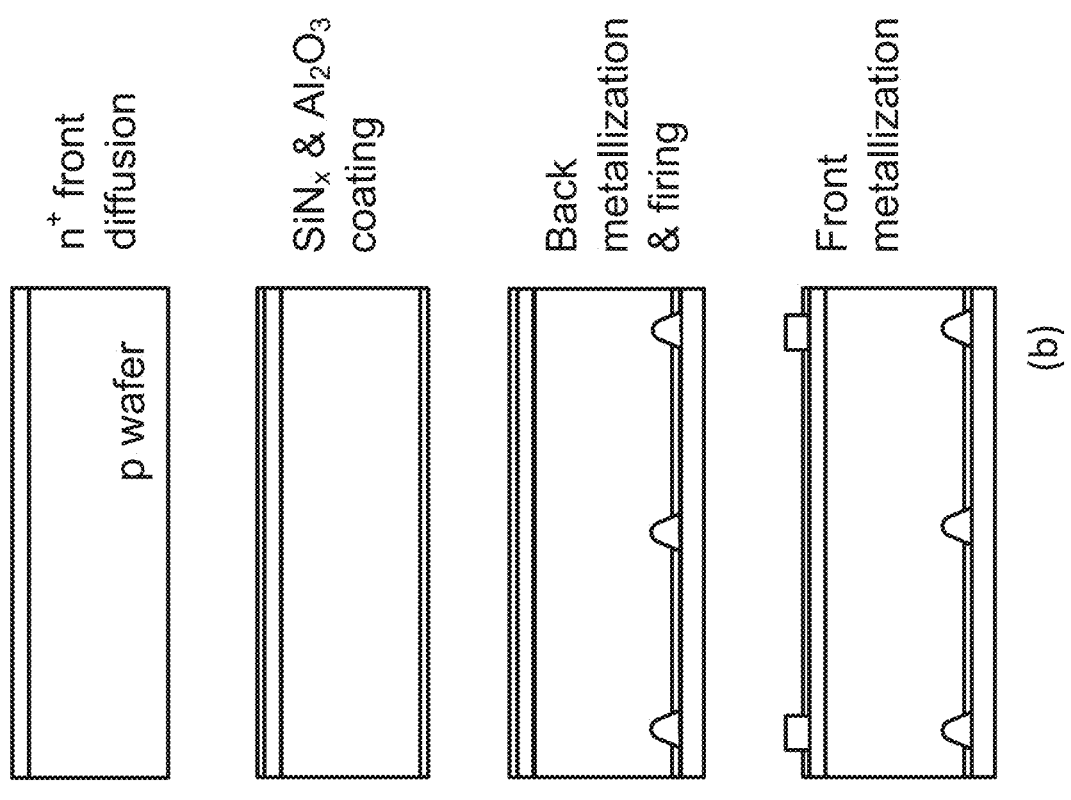
FIG. 16 illustrates a p-type front-emitter point back contact silicon solar cell structure with an electroplated aluminum front electrode and a fabrication process utilizing one step diffusion in accordance with an exemplary embodiment.
Figure 16:
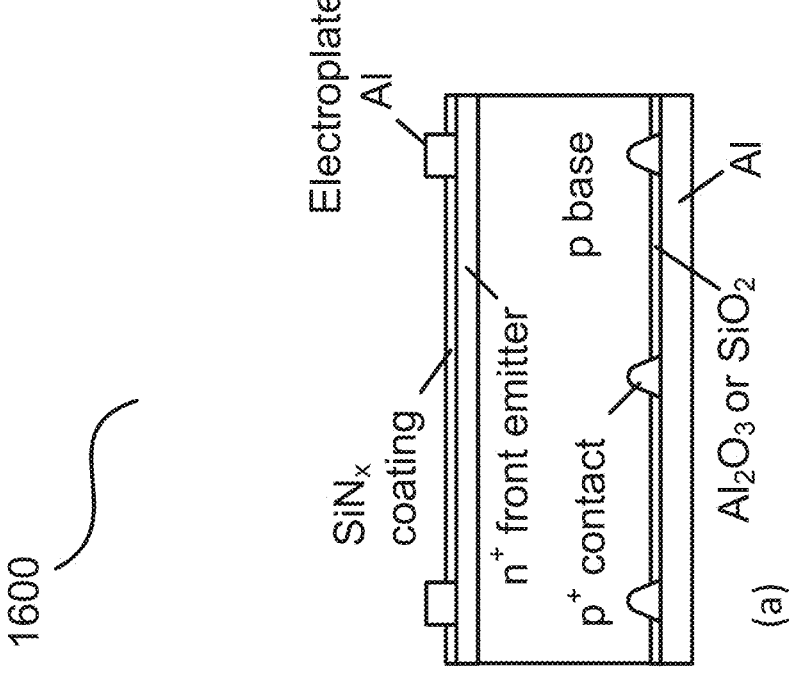

Turning now to FIG. 16, in accordance with various exemplary embodiments, principles of the present disclosure contemplate a p-type front-emitter cell 1600 with point contact for the backside electrode. In this exemplary embodiment, the silicon wafer is p-type, with a resistivity between about 1 Ohm-cm and about 5 Ohms-cm. After cleaning and surface texturing, phosphorus is diffused into the front side of the wafer to a concentration of about $1\times10^{19}$ cm$^{-3}$. Phosphosilicate glass formed on the wafer during diffusion is removed.

In this exemplary embodiment, SiN$_x$ and Al$_2$O$_3$ coating is utilized. An about 50 nm to about 100 nm thick SiN$_x$ layer is deposited on the front side of the wafer (i.e., the phosphorus-diffused side), for example by plasma-enhanced chemical vapor deposition or the like. On the backside of the wafer, an about 5 nm to about 50 nm thick Al$_2$O$_3$ layer is deposited by atomic layer deposition. Alternatively, on the backside of the wafer, an about 5 nm to about 50 nm thick SiO$_2$ layer may be deposited via plasma-enhanced chemical vapor deposition, thermal oxidation, and/or the like. Moreover, the sequence of the front side SiN$_x$ layer and the backside SiO$_2$ or Al$_2$O$_3$ layer may be switched, as desired.

A suitable method may be utilized to form the backside contact. For example, laser annealing may be utilized. In this approach, an aluminum layer is screen-printed onto the backside of the wafer. After firing between about 550° C. and about 800° C. for the screen-printed aluminum, a laser may be utilized to locally heat the backside of the wafer through the aluminum layer. Laser annealing allows the aluminum layer to penetrate the SiO$_2$ or Al$_2$O$_3$ layer and forms a heavily-doped p+ region under the laser spot. An array of p+ regions may be created by moving the laser spot across the back surface; the regions provide a localized p+ back surface field for the solar cell. Alternatively, lithographic patterning may be utilized to create holes in the SiO$_2$ or Al$_2$O$_3$ layer. An aluminum layer is then screen-printed on the patterned SiO$_2$ or Al$_2$O$_3$. The wafer is then fired at between about 600° C. and about 800° C. to form a localized p+ back surface field in the cell.

Front metallization may be accomplished via a suitable method, for example laser ablation or lithography. In laser ablation, a laser is employed to remove SiN$_x$ from the contact area on the front side of the cell. In lithography, lithographic patterning is utilized to create openings in the SiN$_x$ layer. Aluminum electroplating may then be performed on the patterned SiN$_x$ layer, either directly on silicon or preferentially on a seed layer of nickel. When nickel is utilized, a nickel layer of between about 100 nm to about 400 nm is electroplated into the openings in the SiN$_x$ layer, and then an aluminum layer of between about 5 microns and about 25 microns is electroplated onto the nickel seed layer. A final annealing below 500° C. completes the fabrication process for the exemplary cell.

Figure 15:
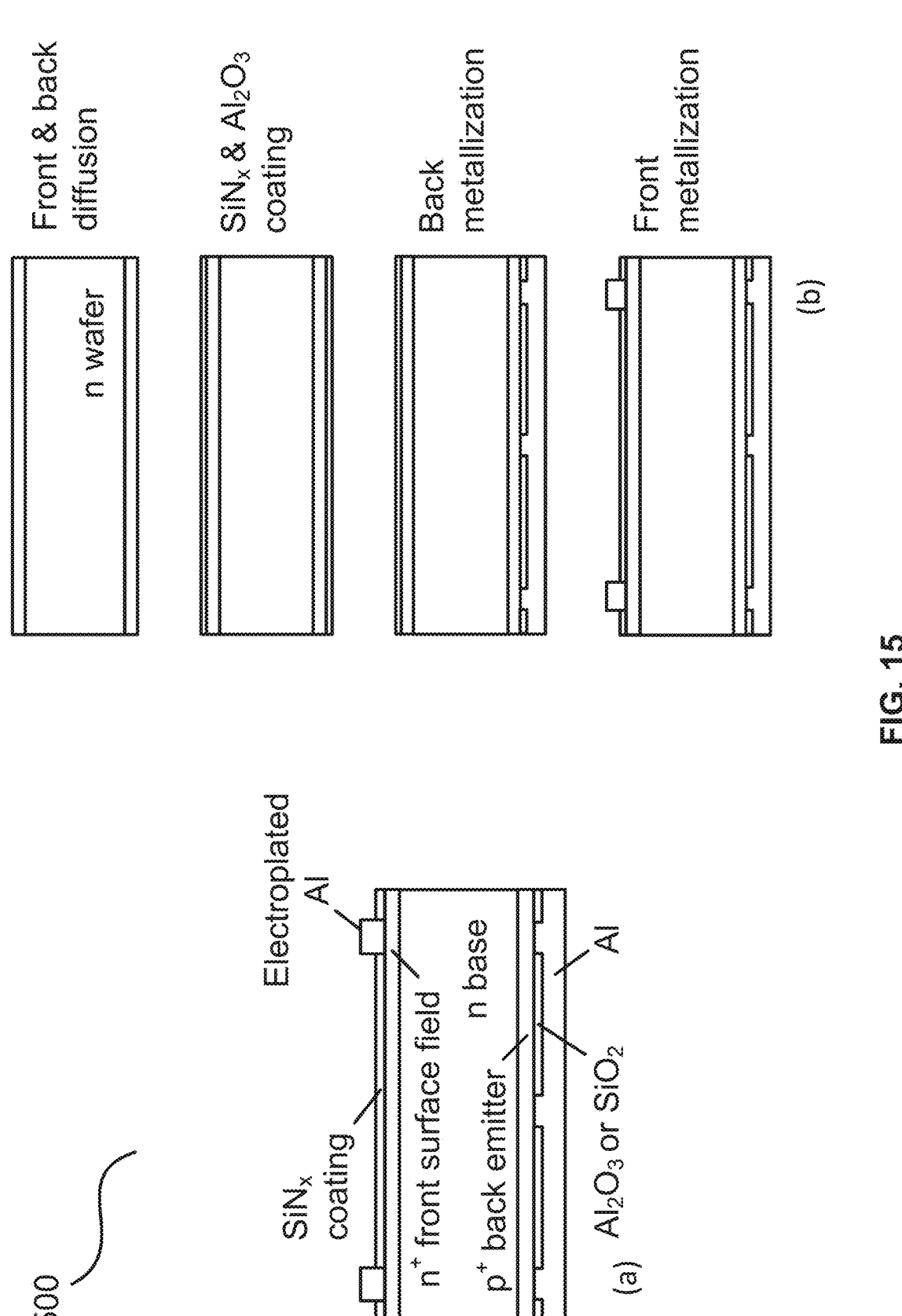
FIG. 15 illustrates an n-type back-emitter point back contact silicon solar cell structure with an electroplated aluminum front electrode and a fabrication process utilizing two step diffusion in accordance with an exemplary embodiment.
Figure 17:
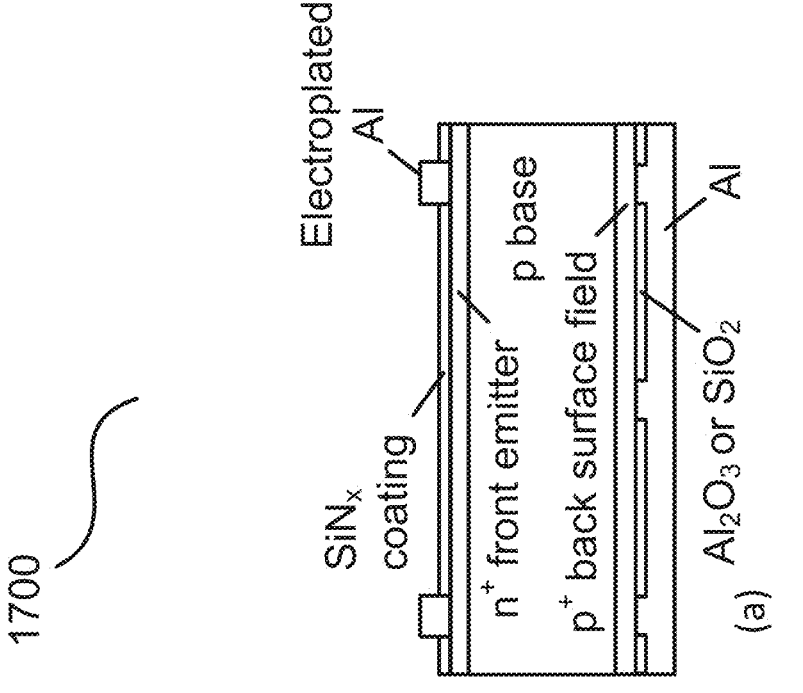
FIG. 17 illustrates a p-type front-emitter point back contact silicon solar cell structure with an electroplated aluminum front electrode and a fabrication process utilizing two step diffusion in accordance with an exemplary embodiment.

FIGS. 15 and 17 disclose additional solar cell structures 1500 and 1700, respectively, wherein point contacts may be utilized for the backside electrode, in accordance with various exemplary embodiments.

While the principles of this disclosure have been shown in various embodiments, many modifications of structure, arrangements, proportions, the elements, materials and components, used in practice, which are particularly adapted for a specific environment and operating requirements may be used without departing from the principles and scope of this disclosure. These and other changes or modifications are intended to be included within the scope of the present disclosure.

The present disclosure has been described with reference to various embodiments. However, one of ordinary skill in the art appreciates that various modifications and changes can be made without departing from the scope of the present disclosure. Accordingly, the specification is to be regarded in an illustrative rather than a restrictive sense, and all such modifications are intended to be included within the scope of the present disclosure. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element.

When a phrase similar to "at least one of A, B, or C" or "at least one of A, B, and C" is used in the claims, the phrase is intended to mean any of the following: (1) at least one of A; (2) at least one of B; (3) at least one of C; (4) at least one of A and at least one of B; (5) at least one of B and at least one of C; (6) at least one of A and at least one of C; or (7) at least one of A, at least one of B, and at least one of C.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Also, as used herein, the terms "coupled," "coupling," or any other variation thereof, are intended to cover a physical connection, an electrical connection, a magnetic connection, an optical connection, a communicative connection, a functional connection, and/or any other connection.

What is claimed is:

1. A method for electroplating aluminum onto a N-type silicon wafer, the method comprising:
preparing an ionic liquid;
cleaning the N-type silicon wafer with at least one of hydrogen fluoride, hydrogen chloride, hydrogen peroxide, or ammonium hydroxide;
diffusing at least one of phosphorus or arsenic onto a front side of the N-type silicon wafer, forming a first layer with a depth, and the first layer is an N+ surface field;
firing an aluminum electrode on the back side of the N-type silicon wafer at a temperature of between 700° C. and 800° C. to form a P+ back emitter;
washing the N-type silicon wafer with alcohol and deionized water; and
annealing the aluminum electrode of the back side at an annealing temperature of between 200° C. and 450° C. to prevent aluminum doping into the N-type silicon wafer.

2. The method of claim 1, wherein the depth of the first layer is between 0.7 and 1.3 micrometers.

3. The method of claim 1, wherein the P+ back emitter has a surface doping concentration of at least $1\times10^{19}$ $cm^{-3}$.

4. The method of claim 1, wherein the P+ back emitter has a thickness of between 7 and 13 micrometers.

5. The method of claim 1, wherein phosphorus is diffused into the front side with a concentration greater than $1\times10^{19}$ $cm^{-3}$.

6. The method of claim 1, wherein arsenic is diffused into the front side with a concentration of greater than $1\times10^{19}$ $cm^{-3}$.

7. The method of claim 1, wherein the P+ back emitter has a doping concentration of at least $1\times10^{19}$ $cm^{-3}$.

8. The method of claim 1, wherein a layer of silicon nitride is deposited on the back side using plasma-enhanced chemical vapor deposition and a layer of $Al_2O_3$ is deposited on the front side using atomic layer deposition with a thickness of 5 nm to 50 nm.

9. The method of claim 1, wherein a layer of silicon nitride is deposited on the front side using plasma-enhanced chemical vapor deposition and a layer of $Al_2O_3$ is deposited on the back side using atomic layer deposition with a thickness of 5 nm to 50 nm, wherein the layer of silicon nitride is deposited using plasma-enhanced chemical vapor deposition.

10. The method of claim 1, further comprising removing phosphosilicate glass formed on the N-type silicon wafer during diffusion.

11. The method of claim 1, wherein the ionic liquid comprises aluminum chloride and an organic halide, and wherein the ionic liquid has a molar ratio of aluminum chloride: organic halide greater than 1.

12. The method of claim 11, further comprising depositing aluminum on the back side of the N-type silicon wafer to form the aluminum electrode, wherein the depositing is performed via a galvanostatic process incorporating the ionic liquid, and wherein the depositing is performed with the ionic liquid at a temperature of between 111° C. and 150° C.

13. The method of claim 11, wherein the organic halide comprises 1-ethyl-3-methylimidazolium.

14. The method of claim 11, further comprising:
depositing at least one of nickel or titanium onto the back side of the N-type silicon wafer to form a layer of nickel or titanium, wherein the layer of nickel or titanium has a thickness of between about 50 nanometers and about 99 nanometers; and
depositing aluminum onto the layer of nickel or titanium to form the aluminum electrode.

15. The method of claim 14, wherein:
the at least one of nickel or titanium is deposited onto the back side of the N-type silicon wafer via a galvanostatic electroplating process to form the layer of nickel or titanium; and
the depositing the aluminum onto the layer of nickel or titanium is performed via a galvanostatic process incorporating the ionic liquid, and the depositing is performed with the ionic liquid at a temperature of between 111° C. and 150° C.

* * * * *